(12) United States Patent
Kodama

(10) Patent No.: US 9,917,054 B2
(45) Date of Patent: Mar. 13, 2018

(54) SEMICONDUCTOR DEVICE INCLUDING A FUSE FORMED ON A HIGH THERMAL CONDUCTIVITY INSULATING FILM

(71) Applicant: RENESAS ELECTRONICS CORPORATION, Tokyo (JP)

(72) Inventor: Eisuke Kodama, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/894,178

(22) PCT Filed: Nov. 27, 2014

(86) PCT No.: PCT/JP2014/081432
§ 371 (c)(1),
(2) Date: Nov. 25, 2015

(87) PCT Pub. No.: WO2016/084202
PCT Pub. Date: Jun. 2, 2016

(65) Prior Publication Data
US 2017/0005036 A1  Jan. 5, 2017

(51) Int. Cl.
*H01L 21/02* (2006.01)
*H01L 21/82* (2006.01)
(Continued)

(52) U.S. Cl.
CPC ........ *H01L 23/5258* (2013.01); *H01L 21/022* (2013.01); *H01L 21/0217* (2013.01);
(Continued)

(58) Field of Classification Search
CPC ............ H01L 23/5256; H01L 23/5258; H01L 23/53295; H01L 23/5226; H01L 21/02532;
(Continued)

(56) References Cited

U.S. PATENT DOCUMENTS 5,047,826 A    9/1991 Keller et al.
5,321,300 A *  6/1994 Usuda ................. H01L 23/5258
                                                257/529
(Continued)

FOREIGN PATENT DOCUMENTS

JP       60-84837 A    5/1985
JP       62-37944 A    2/1987
(Continued)

OTHER PUBLICATIONS

International Search Report from International Patent Application No. PCT/JP2014/081432, dated Mar. 3, 2015.
(Continued)

*Primary Examiner* — Kevin Parendo
(74) *Attorney, Agent, or Firm* — Shapiro, Gabor and Rosenberger, PLLC

(57) ABSTRACT

As means for preventing a leakage of a fuse element cut by laser trimming due to a conductive residue or the like, an insulating film which has a high thermal conductivity and a relatively low adhesion is formed between an element isolation region and the fuse element in the case of forming the fuse element on the element isolation region in a groove on a main surface of an epitaxial substrate. When the fuse element is cut by performing the laser trimming, both of a part of the fuse element and the insulating film below the part of the fuse element are removed.

10 Claims, 15 Drawing Sheets

(51) Int. Cl.
*H01L 23/525* (2006.01)
*H01L 23/532* (2006.01)
*H01L 27/06* (2006.01)

(52) U.S. Cl.
CPC .. *H01L 21/02167* (2013.01); *H01L 21/02488* (2013.01); *H01L 21/02502* (2013.01); *H01L 21/02532* (2013.01); *H01L 21/02595* (2013.01); *H01L 21/82* (2013.01); *H01L 23/53295* (2013.01); *H01L 27/0641* (2013.01)

(58) Field of Classification Search
CPC ......... H01L 21/02595; H01L 21/02167; H01L 21/0217; H01L 21/022; H01L 21/02488; H01L 21/02502
See application file for complete search history.

(56) References Cited

U.S. PATENT DOCUMENTS

| | | | | |
|---|---|---|---|---|
| 6,100,116 | A * | 8/2000 | Lee | H01L 23/5258 257/E23.15 |
| 2002/0153588 | A1 * | 10/2002 | Tatematsu | H01L 23/5258 257/529 |
| 2002/0185738 | A1 | 12/2002 | Kim et al. | |
| 2010/0193867 | A1 * | 8/2010 | Yan | H01L 23/5256 257/355 |
| 2015/0162397 | A1 * | 6/2015 | Chiou | H01L 28/40 257/529 |

FOREIGN PATENT DOCUMENTS

| | | |
|---|---|---|
| JP | 3-241771 A | 10/1991 |
| JP | 2003-037169 A | 2/2003 |
| JP | 2003-086709 A | 3/2003 |
| JP | 2004-111680 A | 4/2004 |
| JP | 2007-311372 A | 11/2007 |
| JP | 2009-044079 A | 2/2009 |

OTHER PUBLICATIONS

Written Opinion of the International Searching Authority from PCT/JP2014/081432, dated Mar. 3, 2015.

Office Action dated Dec. 19, 2017, in Japanese Application No. 2015-544668.

* cited by examiner

SEMICONDUCTOR DEVICE INCLUDING A FUSE FORMED ON A HIGH THERMAL CONDUCTIVITY INSULATING FILM

TECHNICAL FIELD

The present invention relates to a manufacturing method of a semiconductor device and a semiconductor device, and can be used for manufacturing a semiconductor device having a fuse.

BACKGROUND ART

Laser trimming in which adjustment of circuit characteristics or elimination of a defective circuit is performed by cutting a part of a circuit pattern with a laser beam has been known in the manufacturing processes of a semiconductor device. The laser trimming is executed by irradiating a fuse element on a semiconductor wafer with the laser beam. Namely, the laser trimming is performed by irradiating a predetermined fuse element among a plurality of the fuse elements formed of a polysilicon wiring or a metal wiring with the laser beam, thereby melting the fuse element.

Patent Document 1 (Japanese Patent Application Laid-Open Publication No. 2004-111680) describes that a conductive film is formed on a thin-film resistor which is an object to be cut, thereby improving the easiness in cutting the thin-film resistor with a laser beam.

RELATED ART DOCUMENTS

Patent Documents

Patent Document 1: Japanese Patent Application Laid-Open Publication No. 2004-111680

SUMMARY OF THE INVENTION

Problems to be Solved by the Invention

A fuse element of an irradiated portion is sometimes not completely removed even after the fuse element is subjected to the laser irradiation due to a variation in a film thickness of an interlayer film on the fuse element, a variation in a performance of a laser trimming device and others. In this case, a conductive residue adheres to a surface of an element isolation film below the fuse element, and the residue straddles a cut portion of the fuse element to be a leakage path, thereby causing electrical conduction between the cut fuse elements. Since such residue left in this manner leads a decrease in a yield rate of the semiconductor device, it is necessary to reliably remove the conductive residue when performing the laser trimming on the fuse element.

The above and other objects and novel characteristics of the present invention will be apparent from the description of the present specification and the accompanying drawings.

Means for Solving the Problems

The following is a brief description of an outline of the typical invention disclosed in the present application.

In a semiconductor device of an embodiment, an insulating film which has a high thermal conductivity and a relatively low adhesion is formed between an element isolation region and a fuse element in the case of forming the fuse element on the element isolation region.

In addition, in a manufacturing method of a semiconductor device of another embodiment, an insulating film which has a high thermal conductivity and a relatively low adhesion is formed between an element isolation region and a fuse element in the case of forming the fuse element on the element isolation region.

Effects of the Invention

According to an embodiment, it is possible to improve reliability of a semiconductor device. In particular, it is possible to prevent a leakage in a fuse element subjected to laser trimming.

BRIEF DESCRIPTIONS OF THE DRAWINGS

DETAILED DESCRIPTION OF PREFERRED EMBODIMENTS

Figure 1:
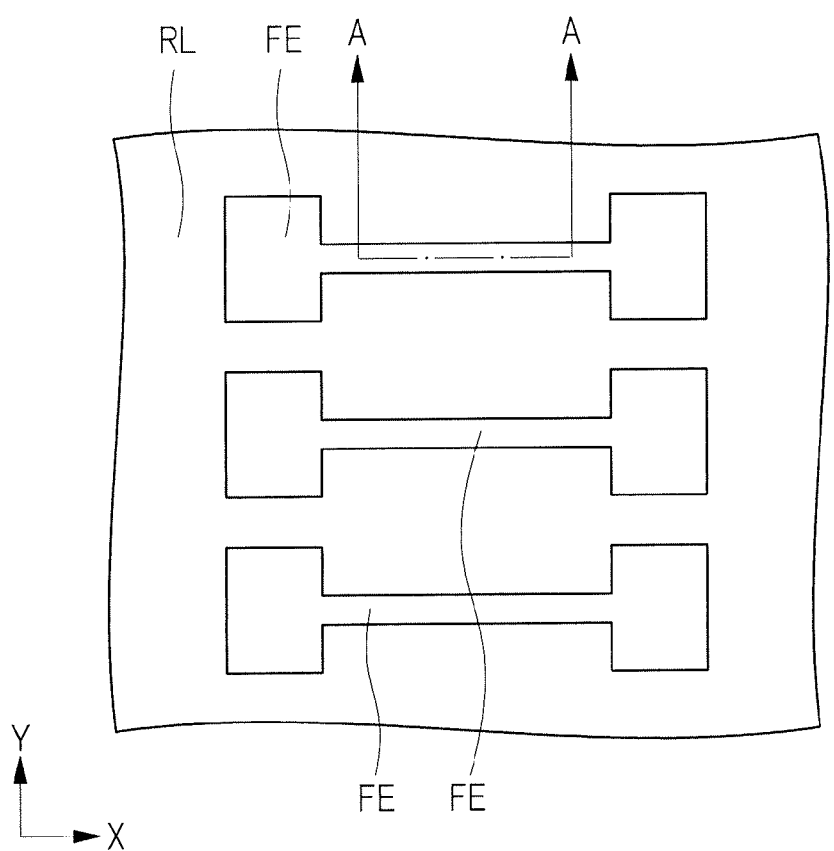
FIG. 1 is a plan view of a semiconductor device of a first embodiment.

Hereinafter, embodiments of the present invention will be described in detail with reference to the accompanying drawings. Note that components having the same function are denoted by the same reference characters throughout the drawings for describing the embodiments, and the repetitive description thereof will be omitted. In addition, the description of the same or similar portions is not repeated in principle unless particularly required in the following embodiments.

Further, reference signs "−" and "+" represent a relative concentration of impurities whose conductivity type is an N type or a P type. For example, the impurity concentration increases in the order of "N⁻", "N" and "N⁺" in the case of an N type impurity. However, the conductivity type of each semiconductor layer is referred to as an N type or a P type regardless of the impurity concentration in some cases. Namely, the semiconductor layers having various types of concentration such as "N⁻", "N" and "N⁺" are collectively referred to as an N type layer, and the semiconductor layers having various types of concentration such as "P⁻", "P" and "P⁺" are collectively referred to as a P type layer in some cases. For example, a P⁺ type layer may be referred to as a P type layer in some cases.

<Structure of Semiconductor Device>

A fuse element in the present embodiment constitutes a part of a circuit pattern in a single semiconductor chip, and is cut by a laser beam in the case where there is a need for performing adjustment of circuit characteristics or elimination of a defective circuit in a manufacturing process of a semiconductor device. However, the fuse element is not necessarily cut in the manufacturing process of the semiconductor device. For example, the fuse element is not cut when a circuit to which the fuse element is connected operates with desired characteristics.

The adjustment of circuit characteristics indicates, for example, the adjustment of a magnitude of current flowing in a predetermined circuit by cutting a fuse connected between a base and an emitter of each bipolar transistor and selectively turning on a specific bipolar transistor in the case where a plurality of the bipolar transistors are connected in parallel to the circuit.

Figure 2:
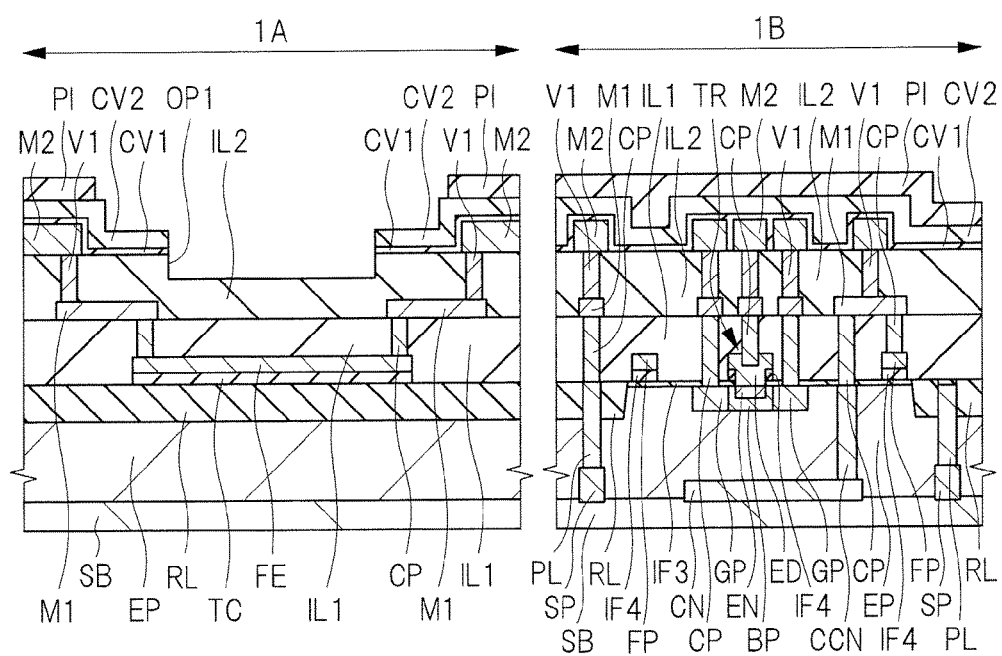
FIG. 2 is a cross-sectional view of the semiconductor device of the first embodiment.
Figure 3:
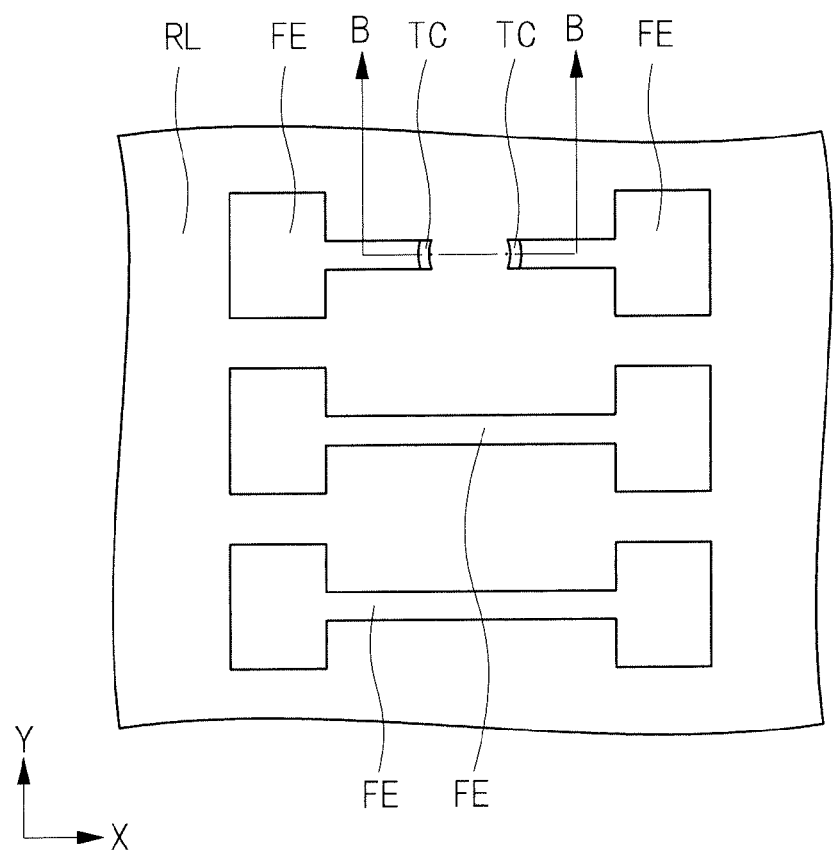
FIG. 3 is a plan view of the semiconductor device of the first embodiment.
Figure 4:
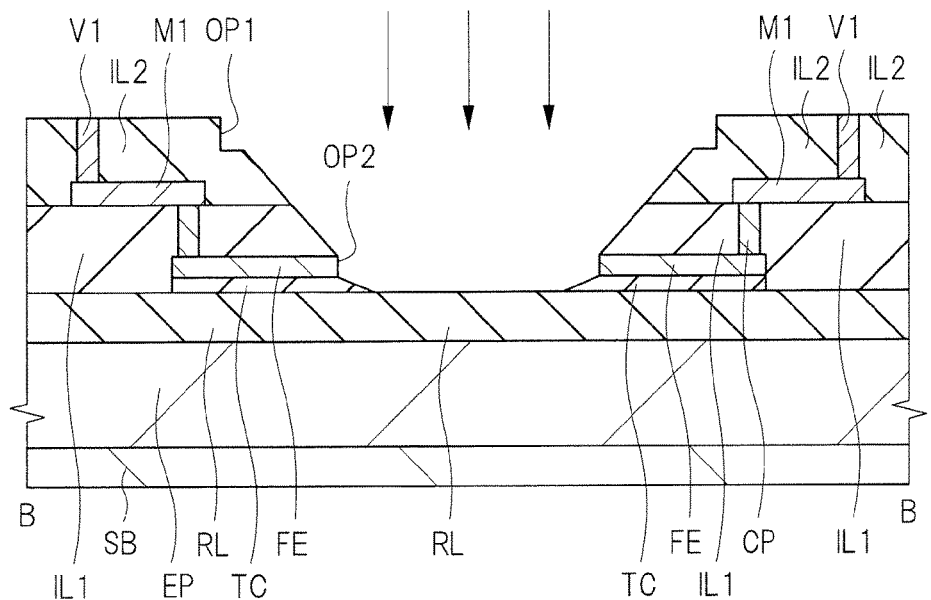
FIG. 4 is a cross-sectional view of the semiconductor device of the first embodiment.

A structure of a semiconductor device according to the present embodiment will be described with reference to FIGS. 1 to 4. FIGS. 1 and 3 are plan views of the semiconductor device according to the present embodiment. FIGS. 2 and 4 are cross-sectional views of the semiconductor device according to the present embodiment, and the left side of FIG. 2 illustrates the cross-sectional view taken along the line A-A of FIG. 1. FIG. 4 is the cross-sectional view taken along the line B-B of FIG. 3. FIGS. 1 and 2 are the views in the case where irradiation with a laser beam is not performed, and FIGS. 3 and 4 are the views including a fuse element cut by being irradiated with a laser beam.

FIG. 1 illustrates a plurality of fuse elements FE that constitute the semiconductor device according to the present embodiment. Note that FIG. 1 illustrates only an element isolation region (first insulating film) RL formed on a semiconductor substrate and the plurality of fuse elements FE formed thereon, and does not illustrate an insulating film TO (see FIG. 2) for heat conduction formed between the fuse element FE and the element isolation region RL and an interlayer insulating film, a wiring, a contact plug, a via, a cover insulating film and the like on the fuse element FE and the element isolation region RL.

As illustrated in FIG. 1, each of the fuse elements FE extends in an X direction along a main surface of an epitaxial substrate (not illustrated) to be used as the semiconductor substrate. The fuse element FE has a contact portion, which has a large width in a Y direction along the main surface of the semiconductor substrate (not illustrated), at both end portions in a longitudinal direction (X direction). The Y direction is orthogonal to the X direction. In the following descriptions, a direction along the main surface of the epitaxial substrate may be simply referred to as a lateral direction in some cases. The contact portion is provided for connecting the contact plug to an upper surface of the end portion of the fuse element FE. The fuse element FE includes an extending portion with a narrow width that connects a pair of the contact portions arranged in the X direction with each other, and the extending portion is irradiated with the laser beam at the time of cutting the fuse element FE.

The width of the extending portion, that is, the width in the Y direction of the fuse element FE of a portion to be cut by the laser irradiation is, for example, 0.3 to 3 μm. In addition, a length in the X direction of the extending portion that connects the contact portions arranged in the X direction with each other is, for example, 1 to 50 μm. Also, a distance between the extending portions of the two fuse elements FE neighboring in the Y direction is, for example, 0.5 to 50 μm. Note that the case of forming the contact portion having a width larger than that of the extending portion has been described in the present embodiment, but the contact portion is just required to have a width capable of connecting the contact plug, and does not always have to have the width larger than that of the extending portion.

In FIG. 2, a cross-sectional view of the fuse element FE is illustrated on the left side, and a cross-sectional view of a bipolar transistor TR formed in the same semiconductor chip as the fuse element FE is illustrated on the right side. Namely, the left side of the drawing illustrates a fuse region 1A and the right side of the drawing illustrates a transistor region 1B.

As illustrated in FIG. 2, the semiconductor device of the present embodiment includes a semiconductor substrate SB and an epitaxial substrate EP which is formed on the semiconductor substrate SB and is used as a part of the semiconductor substrate. The epitaxial substrate is a semiconductor layer formed on the semiconductor substrate by an epitaxial growth method. The epitaxial substrate EP is an N⁻ type Si (silicon) film into which an N type impurity (for example, P (phosphorus)) is introduced, and has a relatively low impurity concentration.

First, a structure of the fuse region 1A will be described below.

In the fuse region 1A, a groove is formed on an upper surface of the epitaxial substrate EP. Note that a sidewall of the groove is not illustrated in the cross-sectional view of the fuse region 1A. Namely, a height of the upper surface of the epitaxial substrate EP in the fuse region 1A is lower than a height of the upper surface of the epitaxial substrate EP in an active region of the transistor region 1B. The element isolation region RL is formed in the groove which is formed on the upper surface of the epitaxial substrate EP of the fuse region 1A.

The element isolation region RL has, for example, a LOCOS (Local Oxidization of Silicon) structure or an STI (Shallow Trench Isolation) structure. The element isolation region RL is mainly made of, for example, a silicon oxide film. An upper surface of the element isolation region RL has a flat surface at a height substantially equal to a height of the upper surface of the epitaxial substrate EP in the active region of the transistor region 1B or at a position slightly higher than the height of the upper surface of the epitaxial substrate EP.

A stacked pattern made up of the insulating film TC (second insulating film) and the fuse element FE formed on the insulating film TC is formed on the element isolation region RL. A lower surface of the insulating film TC is in contact with the upper surface of the element isolation region RL, and a lower surface of the fuse element FE is in contact with the insulating film TC. The insulating film TC has the same pattern as that of the fuse element FE illustrated in FIG. 1 when seen in a plan view. A film thickness of an insulating film IF4 is, for example, 50 to 4000 A (Angstrom). Here, the insulating film IF4 is formed to have a film thickness of 1500 A. A film thickness of the fuse element FE is, for example, 2500 A.

The insulating film TO is made of, for example, an SiN (silicon nitride) film or an SiC (silicon carbide) film. The insulating film TC made of a silicon nitride film or a silicon carbide film has a higher thermal conductivity in comparison with the SiC (silicon oxide) film constituting the element isolation region RL. Specifically, a thermal conductivity of silicon oxide is 1.38 (W/m·K), a thermal conductivity of silicon nitride is 20 to 28 (W/m·K), and a thermal conductivity of silicon carbide is 150 to 170 (W/m·K).

In addition, the insulating film TC made of a silicon nitride film or a silicon carbide film has a relatively low adhesion to an underlying silicon oxide film. Specifically, the adhesion of the insulating film IF4 to a silicon oxide film is lower than the adhesion of a polysilicon film to a silicon oxide film.

It is conceivable that the adhesion between substances decreases as a difference in thermal expansion coefficient or linear expansion coefficient between the substances which adhere to each other increases. Here, while the thermal expansion coefficient of silicon oxide ($SiO_2$) is 0.51 to 0.58 ($\times 10^{-6}$/K), the thermal expansion coefficient of silicon (Si) is 2.4 ($\times 10^{-6}$/K), the thermal expansion coefficient of silicon nitride (SiN) is 3 to 3.5 ($\times 10^{-6}$/K), and the thermal expansion coefficient of silicon carbide (SiC) is 4 to 4.5 ($\times 10^{-6}$/K). Accordingly, the SiN film or the SiC film is more easily peeled off from a surface of the $SiO_2$ film than the Si film.

A main characteristic of the semiconductor device according to the present embodiment lies in that the insulating film TC which has a high thermal conductivity and a low adhesion to an underlying layer is provided between the fuse element FE and the element isolation region RL.

The fuse element FE is illustrated as a film of a single layer in the drawing, but it is constituted to have a stacked structure including, for example, a polysilicon film and a conductive film (not illustrated) stacked on the polysilicon film. The conductive film is made of, for example, a WSi film containing tungsten and silicon or a cobalt silicon (CoSi) film. An N type impurity (for example, As (arsenic)) is introduced into the polysilicon film constituting the fuse element FE at a high concentration. Namely, the polysilicon film is an $N^+$ type semiconductor film. In addition, the fuse element FE may be constituted of only a polysilicon film.

An interlayer insulating film IL1 is formed on the element isolation region RL, the insulating film TC and the fuse element FE so as to cover the upper surface of the element isolation region RL and a stacked film made up of the insulating film IC and the fuse element FE. The interlayer insulating film IL1 is made of, for example, a silicon oxide film. A plurality of contact holes are opened in the interlayer insulating film IL1, and a part of the upper surface of each of the end portions at both sides of the fuse element FE in an extending direction of the fuse element FE, that is, a part of the upper surface of each of the contact portions is exposed on the bottom portion of each of the contact holes.

A contact plug CP mainly made of, for example, tungsten is buried in each of the plurality of contact holes. An upper surface of each of the contact plugs CP and an upper surface of the interlayer insulating film IL1 are planarized at the same height, and a bottom surface of each of the contact plugs CP is connected to the upper surface of the end portion of the fuse element FE. Namely, the contact plug CP is connected to the contact portion which is one end portion of the fuse element FE in the longitudinal direction, and another contact plug CP is connected to the contact portion which is the other end portion of the fuse element FE.

A plurality of patterns of a wiring M1 mainly made of, for example, aluminum are formed on the interlayer insulating film IL1 and the contact plug CP. A bottom surface of the wiring M1 is connected to the upper surface of the contact plug CP. When seen in a plan view, the wiring M1 does not overlap the extending portion between the end portions at both sides of the fuse element FE in the longitudinal direction. An interlayer insulating film IL2 made of, for example, a silicon oxide film is formed on the interlayer insulating film IL1 and the wiring M1 so as to cover the upper surface of the interlayer insulating film IL1 and the wiring M1.

A plurality of via holes are opened in the interlayer insulating film IL2, and a part of an upper surface of the wiring M1 is exposed on a bottom portion of each of the via holes. A via V1 mainly made of, for example, tungsten is buried in each of the plurality of via holes. An upper surface of each of vias V1 and an upper surface of a part of the interlayer insulating film IL2 are planarized at the same height, and a bottom surface of each of the vias V1 is connected to the upper surface of the wiring M1.

A plurality of patterns of a wiring M2 mainly made of, for example, aluminum are formed on the interlayer insulating film IL2 and the via V1. A bottom surface of the wiring M2 is connected to the upper surface of the via V1. When seen in a plan view, the wiring M2 does not overlap the extending portion between the end portions at both sides of the fuse element FE in the longitudinal direction.

Cover insulating films CV1 and CV2 are sequentially stacked on the upper surface of the interlayer insulating film IL2 and the wiring M2. The cover insulating film CV1 is made of, for example, a silicon oxide film, and the cover insulating film CV2 is made of, for example, an SiON (silicon oxynitride) film.

Here, an opening OP1 which reaches an intermediate depth of the interlayer insulating film IL2 is formed in an upper surface of a stacked film including the interlayer insulating film IL2 and the cover insulating films CV1 and CV2. When seen in a plan view, the opening OP1 does not overlap the via V1, the wirings M1 and M2, and the contact plug CP. In addition, when seen in a plan view, the opening OP1 does not overlap the end portion of the fuse element FE to which the contact plug CP is connected, but overlaps a central portion of the fuse element FE in the longitudinal direction, that is, the extending portion. Note that the opening OP1 may penetrate through the interlayer insulating film IL2 to reach the upper surface of the interlayer insulating film IL1.

A distance of an interlayer insulating film (third insulating film) from a bottom surface of the opening OP1 to the upper surface of the fuse element FE is, for example, 500 to 8000 A. The opening OP1 is a groove that is provided by preliminarily removing a part of the interlayer insulating film IL2 and the cover insulating films CV1 and CV2 to be obstacles so as to be able to irradiate the fuse element FE appropriately with the laser beam at the time of performing the laser trimming.

An upper surface of the cover insulating film CV2 is covered with a passivation film PI made of a polyimide film. However, the passivation film PI is not formed right above the opening OP1 and in the vicinity of the opening OP1.

Next, a structure of the transistor region 1B will be described below.

A plurality of grooves are formed on the upper surface of the epitaxial substrate EP, and the element isolation region RL is buried in each of the plurality of grooves. A region sandwiched by the neighboring element isolation regions RL is the active region, and the upper surface of the epitaxial substrate EP is not covered with the element isolation region RL in the active region.

An $N^+$ type buried layer CN which is an $N^+$ type semiconductor layer is formed right below the active region on a lower surface of the epitaxial substrate EP. Namely, the $N^+$ type buried layer CN is formed in the epitaxial substrate EP at a part that is in contact with an interface between the epitaxial substrate EP and the semiconductor substrate SB. In the epitaxial substrate EP, an N type contact layer CCN which is an N type semiconductor layer is formed from an end portion of the $N^+$ type buried layer CN to the main surface of the epitaxial substrate EP. Namely, a part of the N type contact layer CCN is formed on the main surface of the epitaxial substrate EP, and another part thereof is connected to the $N^+$ type buried layer CN.

An N type impurity (for example, Sb (antimony)) is introduced into the $N^+$ type buried layer CN, and an N type impurity (for example, P (phosphorus)) is introduced into the N type contact layer CCN. The $N^+$ type buried layer CN constitutes a collector layer of the bipolar transistor TR.

A $P^+$ type buried layer SP which is a $P^+$ type semiconductor layer is formed on the lower surface of the epitaxial substrate EP next to the active region. A region which is not covered with the element isolation region RL is present on a part of the main surface of the epitaxial substrate EP right above the $P^+$ type buried layer SP, and a P type layer PL is formed from an upper surface of the corresponding region to the $P^+$ type buried layer SP. The P type layer PL is sandwiched by the element isolation regions RL arranged in the lateral direction in the vicinity of the main surface of the epitaxial substrate EP.

A P type impurity (for example, B (boron)) is introduced into the $P^+$ type buried layer SP and the P type layer PL. The $P^+$ type buried layer SP and the P type layer PL are element isolation layers provided so as to isolate semiconductor elements formed side by side in the epitaxial substrate EP from each other.

A $P^-$ type layer BP and a $P^+$ type layer GP whose formation depth is shallower than that of the element isolation region RL are formed side by side in the main surface of the epitaxial substrate EP right above the $N^+$ type buried layer CN. The $P^-$ type layer BP and the $P^+$ type layer GP are P type semiconductor layers that are formed by implanting a P type impurity (for example, B (boron)) into the main surface of the epitaxial substrate EP, and the $P^+$ type layer OP has a higher impurity concentration than the $P^-$ type layer BP. The $P^-$ type layer BP is sandwiched by a pair of the $P^+$ type layers CP, and the $P^-$ type layer BP and the pair of $P^+$ type layers GP are in contact with each other. Each of the $P^-$ type layer BP and the $P^+$ type layer GP has substantially the same formation depth. The $P^-$ type layer BP constitutes a base layer of the bipolar transistor TR. The $P^+$ type layer GP is a connection layer that supplies potential to the $P^-$ type layer BP serving as the base layer.

An $N^+$ type layer EN is formed on a part of an upper surface of the $P^-$ type layer BP. The $N^+$ type layer EN is a semiconductor layer into which an N type impurity (for example, As (arsenic)) is introduced, and constitutes an emitter layer of the bipolar transistor TR. A formation depth of the $N^+$ type layer EN is shallower than that of the $P^-$ type layer BP. A part of the $P^-$ type layer BP is formed on the main surface of the epitaxial substrate EP next to the $N^+$ type layer EN.

Most of the main surface of the epitaxial substrate EP is covered with an insulating film IF3. The insulating film IF3 is made of a silicon oxide film. The insulating film IF3 is opened right above the P type layer PL, the N type contact layer CCN and the $N^+$ type layer EN. An emitter electrode ED is formed right above the $P^-$ type layer BP in the active region. The emitter electrode ED is in direct contact with an upper surface of the $N^-$ type layer EN serving as the emitter layer, and a part of the emitter electrode ED is formed right above the $P^-$ type layer BP next to the $N^-$ type layer EN with the insulating film IF3 and the insulating film IF4 sequentially interposed therebetween. Specifically, the insulating film IF4 is formed on the insulating film IF3, a part of the emitter electrode ED is formed on the insulating film IF4, an opening is provided in the insulating films IF3 and IF4 right above the $N^+$ type layer EN, and another part of the emitter electrode ED is buried in the opening.

In addition, in an end portion of the active region which does not overlap the $N^+$ type buried layer CN when seen in a plan view, an anti-inversion plate FP is formed on the insulating film IF3 with the insulating film IF4 interposed therebetween. Each of the anti-inversion plate FP and the emitter electrode ED has a stacked structure including an $N^-$ type polysilicon film and a metal-containing film formed on the polysilicon film like the fuse element FE. Note that a boundary between the films constituting the stacked structure is not illustrated in the drawing. In addition, each of the fuse element FE, the anti-inversion plate FP and the emitter electrode ED may be constituted of only a polysilicon film.

The interlayer insulating film IL1 is formed on the epitaxial substrate EP so as to cover the insulating film IF4, the insulating film IF3, the anti-inversion plate FP and the emitter electrode ED. The plurality of contact holes are opened in the interlayer insulating film IL1, and the contact plug CP is buried in each of the contact holes. Each of the plurality of contact plugs CP penetrates through the insulating film IF3, and is connected to an upper surface of the P type layer PL, an upper surface of the N type contact layer CCN, or an upper surface of the $P^+$ type layer GP. In addition, other contact plugs CP are connected to the upper surface of the emitter electrode ED or an upper surface of the anti-inversion plate FP.

A plurality of the wirings M1 and the interlayer insulating film IL2 that covers the plurality of wirings M1 are formed on the interlayer insulating film IL1. Each of the plurality of wirings M1 is connected to the upper surface of any one of the plurality of contact plugs CP. The via V1 connected to the upper surface of the wiring M1 is formed in each of the plurality of via holes that penetrate through the interlayer insulating film IL2. The wiring M2 which is electrically connected to the wiring M1 through the via V1, the cover insulating film CV1 which covers the upper surface of the interlayer insulating film IL2 and the wiring M2, and the cover insulating film CV2 which covers the upper surface of the cover insulating film CV1 are formed on the interlayer insulating film IL2. In addition, the upper surface of the cover insulating film CV2 is covered with the passivation film PI.

An NPN-type bipolar transistor TR which includes the N$^+$ type layer EN serving as the emitter layer, the P$^-$ type layer BP serving as the base layer, and the N$^+$ type buried layer ON serving as the collector layer is formed in the transistor region 1B. One end portion of the fuse element FE formed in the fuse region 1A is connected to the emitter electrode ED of the bipolar transistor TR through the contact plug CP, the wiring M1, the via V1, the wiring M2, and the like. In addition, the other end portion of the fuse element FE is connected to the P$^-$ type layer BP serving as the collector layer of the bipolar transistor TR through the contact plug CP, the wiring M1, the via V1, the wiring M2, and the like.

Since the fuse element FE is connected in series between the emitter and the collector of the bipolar transistor TR, the emitter and the collector of the bipolar transistor TR have the same potential as long as the fuse element FE is electrically conducted, and thus, the bipolar transistor TR does not become an on-state. Namely, it is possible to select whether to use the bipolar transistor TR by selecting whether to cut the fuse element FE in a manufacturing process of the semiconductor device. Since it is possible to apply different potentials to the emitter and the collector of the bipolar transistor TR by cutting the fuse element FE, it is possible to use the bipolar transistor TR as a switching element, an amplifying element or the like in the circuit.

At the time of cutting the fuse element FE, the central portion (extending portion) of the fuse element FE formed in the fuse region 1A of FIG. 2 is irradiated with the laser beam from above. In the present application, cutting the fuse element FE by the laser irradiation is referred to as the laser trimming. In the laser trimming process, the laser irradiation is performed from above the fuse element FE covered with the interlayer insulating films IL1 and IL2, and thus, the interlayer insulating films IL1 and IL2 right above the fuse element FE are also removed. Hereinafter, a structure of the semiconductor device of the present embodiment in a case where the laser trimming is performed will be described with reference to FIGS. 3 and 4. FIG. 4 illustrates the fuse region in an enlarged manner, and illustrations of the film and others provided above the interlayer insulating film IL2 are omitted so as to make the drawing easily understood.

In FIG. 3, one fuse element among the plurality of fuse elements FE arranged on the element isolation region RL is cut by the laser trimming. A part to be cut by the laser irradiation is not the end portion in the longitudinal direction of the fuse element FE extending in the X direction, but a central part of the extending portion. A part of the fuse element FE is removed by the laser trimming, and the upper surface of the element isolation region RL is exposed from the fuse element FE and the insulating film TC in a region from which the part of the fuse element FE has been removed.

Here, a part of the insulating film TC formed below the fuse element FE is also removed, and an end portion of the insulating film TC is exposed from the fuse element FE in the vicinity of a boundary between a region from which the part of the insulating film TO has been removed and a region in which the insulating film TC is left. Namely, when seen in a plan view, the end portion of the insulating film TC does not overlap the fuse element FE, and terminates at a region closer to a laser-irradiated portion than the fuse element FE. In other words, the amount of recession of the insulating film TO by the laser trimming is smaller than the amount of recession of the fuse element FE by the laser trimming.

As illustrated in FIG. 4, not only the fuse element FE but also each part of the insulating film IC below the fuse element FE and the interlayer insulating films IL1 and IL2 on the fuse element FE is removed in the region in which the laser trimming has been performed, and thus, an opening OP2 which penetrates through the stacked film including the insulating film TC, the fuse element FE, and the interlayer insulating films IL1 and IL2 is formed. The upper surface of the element isolation region RL is exposed on a bottom portion of the opening OP2. The fuse element FE is cut (divided) by the opening OP2.

Sidewalls of the interlayer insulating films IL1 and IL2 and the insulating film TC which are exposed on the sidewall inside the opening OP2 are tapered in comparison with the fuse element FE. A cross section of the fuse element FE cut by the laser trimming, that is, a sidewall of the fuse element FE has an angle close to an angle perpendicular to the main surface of the epitaxial substrate EP. On the other hand, sidewalls of the interlayer insulating films IL1 and IL2 and the insulating film TC which are exposed in the opening OP have an angle smaller than 90° with respect to the main surface of the epitaxial substrate EP.

Namely, each of the interlayer insulating films IL1 and IL2 and the insulating film TC has an opening width that gradually becomes larger from the lower side toward the upper side in the opening OP2. Thus, in the opening OP2, the end portion of the insulating film TC terminates at a position close to the region from which the fuse element FE and the insulating film TC have been removed, that is, a center of the laser-irradiated portion in comparison with the end portion of the fuse element FE. In other words, the end portion of the insulating film TC formed on the sidewall of the opening OP2 terminates at a position closer to a center of the opening OP2 than the end portion of the fuse element FE formed on the sidewall of the opening OP2 when seen in a plan view.

In the laser trimming process, the fuse element FE is irradiated with the laser beam over the interlayer insulating films IL1 and IL2 and the fuse element FE absorbs heat, so that a part of the fuse element FE is vaporized and exhausted. Thus, by removing a part of the fuse element FE, the resistance of the fuse element FE is increased and the fuse element FE becomes an electrically insulated state. In this manner, the fuse element FE is cut. When the fuse element FE is vaporized and exhausted, a part of the interlayer insulating films IL1 and IL2 on the fuse element FE is also removed and opened.

Here, the insulating film: TC is a film having a thermal conductivity higher than that of the silicon oxide film constituting the element isolation region RL, the insulating film IF3 and the like. Accordingly, in the laser trimming process, heat is conducted to the insulating film TC during the laser irradiation, and thus the insulating film TC is also vaporized.

Figure 23:
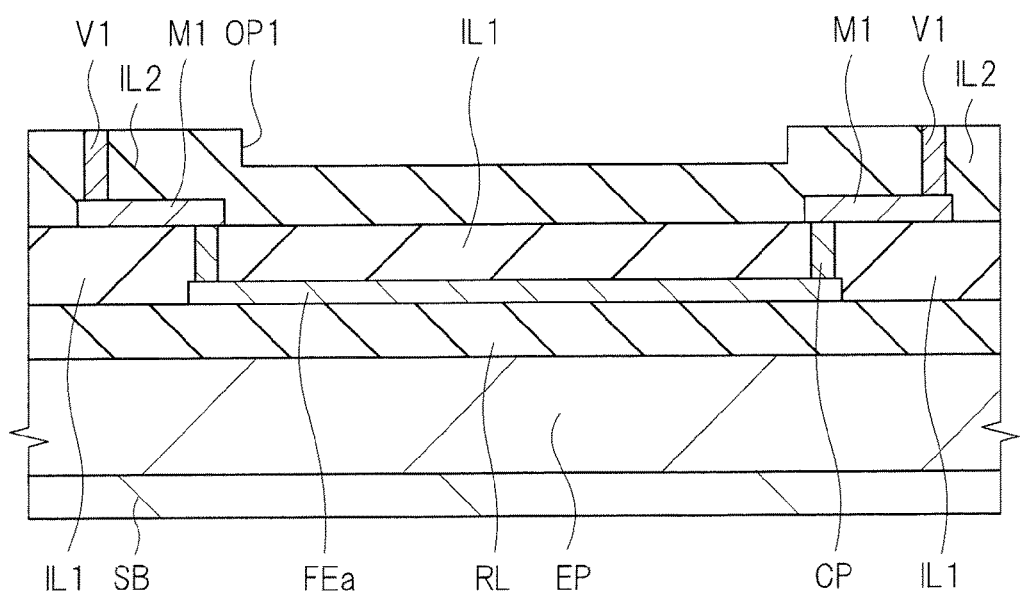
FIG. 23 is a cross-sectional view of a semiconductor device of a comparative example.
Figure 24:
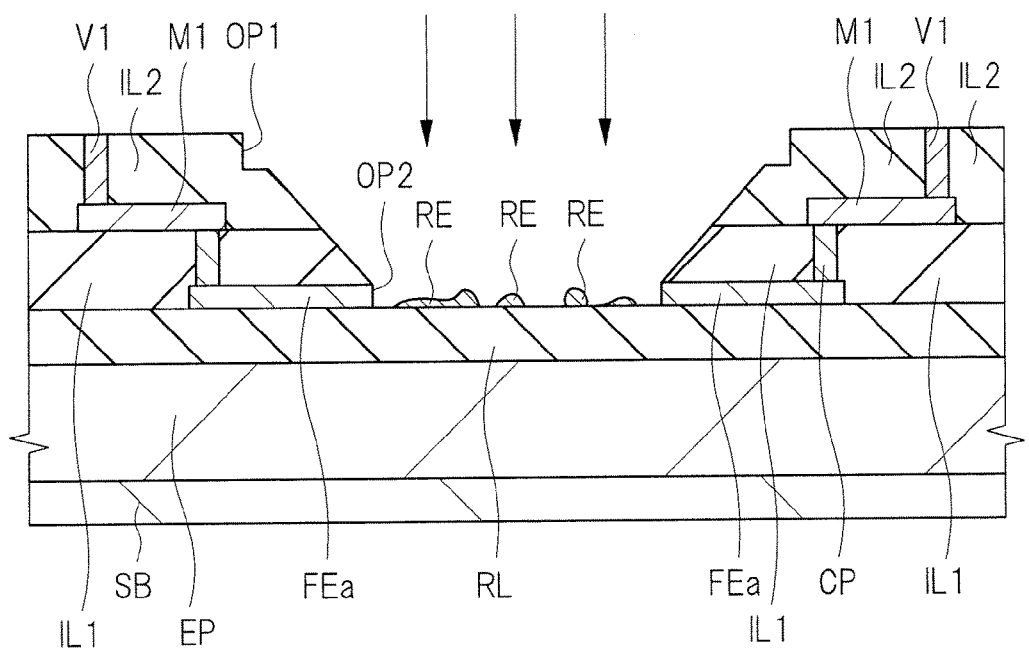
FIG. 24 is a cross-sectional view of the semiconductor device of the comparative example.

Hereinafter, an effect of the semiconductor device of the present embodiment will be described with reference to a semiconductor device of a comparative example illustrated in FIGS. 23 and 24. FIG. 23 is a cross-sectional view of the semiconductor device of the comparative example including a fuse element which is not subjected to the laser trimming. FIG. 24 is a cross-sectional view of the semiconductor device of the comparative example including a fuse element which is subjected to the laser trimming. Note that the bipolar transistor is not illustrated in FIGS. 23 and 24. FIGS. 23 and 24 illustrate the fuse region in an enlarged manner, and illustrations of the film and others provided above the interlayer insulating film IL2 are omitted so as to make the drawing easily understood.

As illustrated in FIGS. 23 and 24, a structure of a fuse element FEa and the vicinity thereof according to the comparative example is substantially the same structure as the fuse element of the present embodiment that has been described with reference to FIGS. 1 to 4. However, the semiconductor device of the comparative example is different from the present embodiment in that the fuse element FEa is formed to be in contact with the upper surface of the element isolation region RL and the insulating film TC (see FIGS. 2 to 4) is not formed between the fuse element FEa and the element isolation region RL. In other words, in the comparative example, the insulating film having a thermal conductivity higher than that of a silicon oxide film is not formed between the fuse element FEa and the element isolation region RL.

In the case where the laser trimming is performed on the fuse element FEa of the comparative example as described above, it is conceivable that a part of the fuse element FEa remains as a residue or a part of the fuse element FEa that has once been vaporized adheres to and is deposited on the upper surface of the element isolation region RL. In these cases, a conductive residue RE is formed on the upper surface of the element isolation region RL in a region from which the fuse element FEa has been removed.

This is because it is difficult to remove the fuse element FEa without leaving the residue RE and to prevent the element isolation region RL from being destroyed and having an abnormal shape in the laser trimming process. Namely, it is difficult to enhance accuracy of the laser irradiation, and further, it is difficult to enhance accuracy of the film thickness of the interlayer insulating films IL1 and IL2 on the fuse element FEa and below the opening OP1.

Thus, it is conceivable that the fuse element FEa is not sufficiently vaporized or a part of the vaporized fuse element FEa is cooled and adheres to the upper surface of the element isolation region RL when the output of the laser beam is excessively low, the film thickness of the interlayer insulating films IL1 and IL2 on the fuse element FEa is large, or the like. Here, when the conductive residue RE adheres between the contact portions at both sides of the fuse element FEa divided by the laser irradiation, there is a risk that the residue RE becomes a leakage path between the contact portions at both sides of the fuse element FEa. Namely, the fuse element FEa which is supposed to be cut by the laser trimming is electrically conducted by the residue RE, thereby causing a problem that the semiconductor device does not normally operate.

In addition, in the case where the output of the laser beam is excessively high, although the fuse element FEa is reliably removed, there is a risk that a surface of the element isolation region RL is destroyed by the laser irradiation to have the abnormal shape and a yield rate of a product is decreased.

In addition, as a method of preventing the leakage of the fuse element FEa due to the residue RE, it is conceivable to increase an extending length of the fuse element FEa to widen a range (spot size) which is irradiated with the laser beam. In such a case, it seems that it is possible to decrease a possibility that the leakage path is formed or to increase a resistance value of the leakage path formed by the residue RE even when the residue RE adheres between the conductive films constituting the fuse element FEa divided by the laser irradiation.

However, it is difficult to widen the irradiation range of the laser beam in the single laser irradiation. In addition, if the laser irradiation is performed a plurality of times by shifting the irradiation position of the laser beam, there is a risk that the element isolation region EL is destroyed due to the excessive laser irradiation in a position at which the irradiation ranges of the laser beams overlap each other. In addition, in the case where the irradiation ranges of the laser beams do not overlap each other, a part of the fuse element FE remains in a region which is not subjected to the laser irradiation between each of the plurality of laser irradiation regions, and this causes the leakage. It is difficult to perform the laser irradiation a plurality of times by shifting the irradiation position to adjacent regions with high accuracy in order to prevent the occurrence of such problems.

Meanwhile, in the semiconductor device of the present embodiment, the insulating film TC made of a material having a high thermal conductivity is provided between the fuse element FE and the element isolation region RL as illustrated in FIG. 2. The insulating film TC provided below the fuse element FE is removed together with the fuse element FE in the laser trimming process.

Accordingly, the conductive residue RE (see FIG. 24) which is formed of a residue of the fuse element FE or the like hardly adheres to the upper surface of the element isolation region RL below the region from which the fuse element FE has been removed, and thus, it is possible to prevent the occurrence of the leakage caused by the decrease of the resistance value of the fuse subjected to the laser trimming due to the residue RE.

This is because the heat of the fuse element is transferred to the insulating film TC having a high thermal conductivity when the fuse element FE is heated by the laser irradiation, so that the fuse element FE and the insulating film TC are vaporized. In this manner, the vaporization (volatilization) of the fuse element FE is promoted from a lower side of the fuse element FE by a vaporization pressure of the insulating film TC, and the fuse element FE can be more reliably removed. In addition, even when a part of the insulating film TO is not vaporized and remains and adheres to the upper surface of the element isolation region RL as the residue, since the insulating film TC is made of an insulator, the residue does not cause the leakage of the fuse element FE. Accordingly, it is possible to improve the reliability of the semiconductor device.

In addition, since the insulating film TC is the film having the lower adhesion to the silicon oxide film constituting the element isolation region RL than the adhesion of a polysilicon film to a silicon oxide film, the insulating film TC is easily peeled off and removed from a side of the element isolation region RL during the laser irradiation. Accordingly, in the laser trimming process of removing the fuse element FE and the insulating film TC, a part of the surface of the underlying element isolation region RL is peeled off together with the insulating film TC, so that it is possible to prevent the element isolation region RL from having the abnormal shape. Thus, it is possible to improve the reliability of the semiconductor device.

In addition, in FIG. 24, the leakage path between the fuse elements FEa divided by the laser irradiation is only the upper surface of the element isolation region RL and is relatively short. On the other hand, in the present embodiment, the insulating film TC is provided and a part of the insulating film TC is removed by the laser trimming as illustrated in FIG. 4. Here, since the insulating film TC is provided, the path in which the leakage current can flow between the fuse elements FE divided by the laser irradiation is formed to be long in comparison with that of the comparative example.

Specifically, the path from one terminal end of the fuse element FE in the opening OP2 to the other terminal end of the fuse element FE extending along the tapered sidewall of the insulating film TC and the upper surface of the element isolation region RL is longer than the path from one terminal end of the fuse element FEa to the other terminal end of the fuse element FEa extending along only the upper surface of the element isolation region Rb in the comparative example illustrated in FIG. 24.

Accordingly, even when the residue RE (see FIG. 24) adheres between the fuse elements FE divided by the laser trimming of the present embodiment, since the path in which the leakage current flows is long, it is possible to prevent a short circuit or the like due to the residue RE and prevent the occurrence of the leakage. In addition, since it is possible to lengthen the leakage path, it is possible to prevent the decrease of the resistance value of the fuse subjected to the laser trimming due to the leakage. Accordingly, it is possible to prevent the abnormal operation of the circuit connected to the fuse element FE. Thus, it is possible to improve the reliability of the semiconductor device.

<Manufacturing Method of Semiconductor Device>

A manufacturing method of the semiconductor device of the present embodiment will be described with reference to FIGS. 5 to 13.

FIGS. 5 to 13 are cross-sectional views illustrating a manufacturing process of the semiconductor device of the present embodiment. In FIGS. 5 to 13, the fuse region 1A is illustrated on the left side of each drawing, and the transistor region 1B is illustrated on the right side. The fuse element and the bipolar transistor are formed in the fuse region 1A and the transistor region 1B, respectively.

Figure 5:
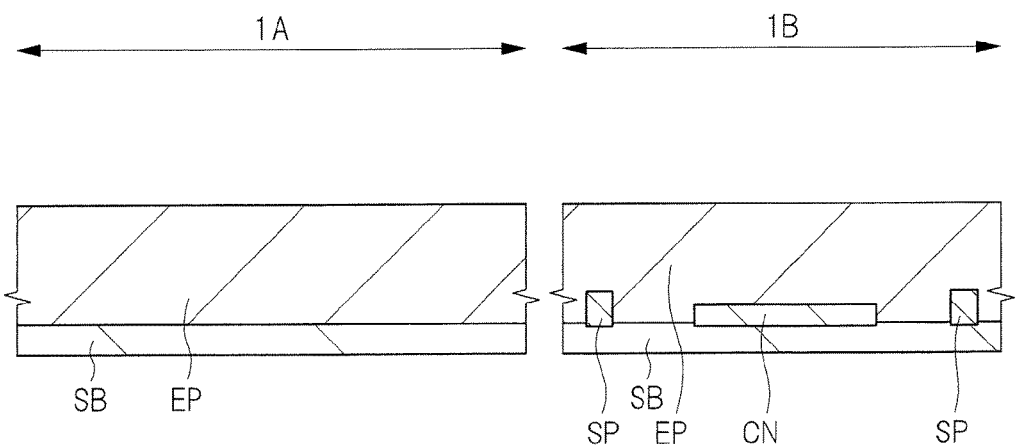
FIG. 5 is a cross-sectional view illustrating a manufacturing process of the semiconductor device of the first embodiment.

First, the P type semiconductor substrate SB containing B (boron) is prepared as illustrated in FIG. 5. Thereafter, Sb (antimony) as an N type impurity is ion-implanted into a part of the upper surface of the semiconductor substrate SB of the transistor region 1B, B (boron) as a P type impurity is ion-implanted into another part of the upper surface of the semiconductor substrate SB of the transistor region 1B, and then, the semiconductor substrate SB is subjected to heat treatment. Subsequently, the epitaxial substrate EP is formed on the semiconductor substrate SB by an epitaxial growth method.

The epitaxial substrate EP mainly contains P (phosphorus) and is formed of $N^-$ type semiconductor having a relatively low impurity concentration. However, on the lower surface of the epitaxial substrate EP of the transistor region 1B, the $P^+$ type buried layer SP containing B (boron) is formed right above the upper surface of the semiconductor substrate SB into which B (boron) is ion-implanted. In addition, on the lower surface of the epitaxial substrate EP of the transistor region 1B, the $N^+$ type buried layer CN containing Sb (antimony) is formed right above the upper surface of the semiconductor substrate SB into which Sb (antimony) is ion-implanted.

Figure 6:
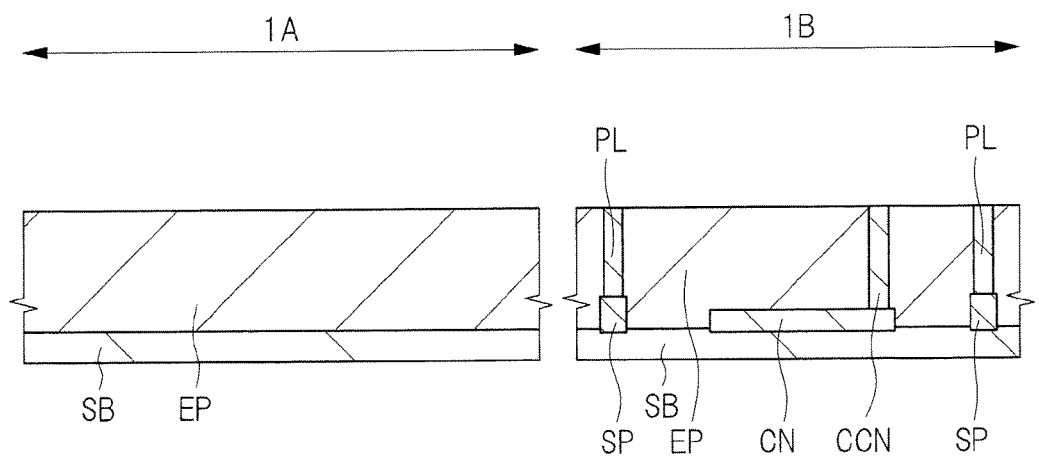
FIG. 6 is a cross-sectional view illustrating the manufacturing process of the semiconductor device continued from FIG. 5.

Next, the P type layer PL serving for isolation between elements is formed in the epitaxial substrate EP right above the $P^+$ type buried layer SP as illustrated in FIG. 6. The P type layer PL can be formed by ion-implantation of B (boron) to the main surface of the epitaxial substrate EP and heat application. Thereafter, the N type contact layer CCN is formed in the epitaxial substrate EP by ion-implantation of an N type impurity (for example, P (phosphorus)) to the main surface of the epitaxial substrate EP and heat application. Any of the N type contact layer CCN and the P type layer PL may be formed first.

The P type layer PL is formed from an upper end of the $P^+$ type buried layer SP to the main surface of the epitaxial substrate EP right above the $P^+$ type buried layer SP. The N type contact layer CCN is formed from an upper end of the $N^+$ type buried layer CN to the main surface of the epitaxial substrate EP right above the end portion of the $N^+$ type buried layer CN. The N type contact layer CCN is a contact layer for supplying potential to the $N^+$ type buried layer CN from the main surface side of the epitaxial substrate EP.

Figure 7:
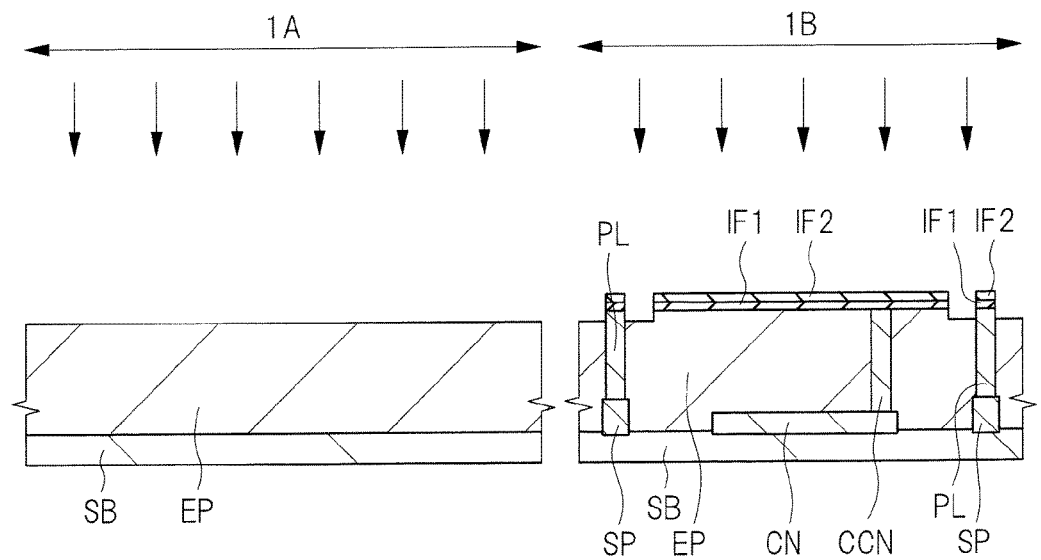
FIG. 7 is a cross-sectional view illustrating the manufacturing process of the semiconductor device continued from FIG. 6.

Next, as illustrated in FIG. 7, the insulating film IF1 made of a silicon oxide film is formed on the main surface of the epitaxial substrate EP by using a thermal oxidation method or the like, and then, the insulating film IF2 made of a silicon nitride film or the like is formed on the insulating film IF1 by using, for example, a CVD (Chemical Vapor Deposition) method. Thereafter, the stacked film made up of the insulating films IF2 and IF1 is patterned by using a photolithography technique and an etching method.

The stacked film is all removed in a position in which the pattern of the fuse element is to be formed in the fuse region 1A. Also, in the transistor region 1B, the stacked film covers the main surface of the epitaxial substrate EP in a region right above the $N^+$ type buried layer CN and in the vicinity thereof, and further covers the upper surface of the P type layer PL in a region separated from that region. The above-described stacked film that has covered the main surface of the epitaxial substrate EP between the region right above the $N^+$ type buried layer CN and in the vicinity thereof and the upper surface of the P type layer PL is removed.

Subsequently, by performing the dry etching with using the above-described stacked film as a mask, the main surface of the epitaxial substrate EP is etched back, thereby forming a plurality of grooves. In the fuse region 1A illustrated in the drawing, the main surface of the epitaxial substrate EP entirely recedes.

Figure 8:
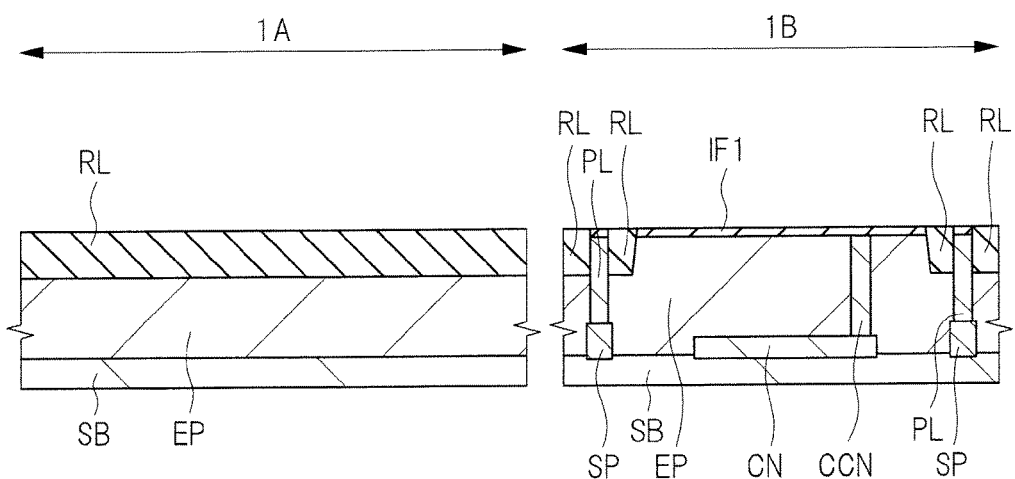
FIG. 8 is a cross-sectional view illustrating the manufacturing process of the semiconductor device continued from FIG. 7.

Next, as illustrated in FIG. 8, oxidation treatment is performed to form the element isolation region RL made of a silicon oxide film in the plurality of grooves. In this manner, the inside of each of the plurality of grooves is buried with the element isolation region RL. Thereafter, the insulating film IF2 is removed. The active region sandwiched by the neighboring element isolation regions RL in the transistor region 1B and the upper surface of the P type layer PL are covered with the insulating film IF1.

Figure 9:
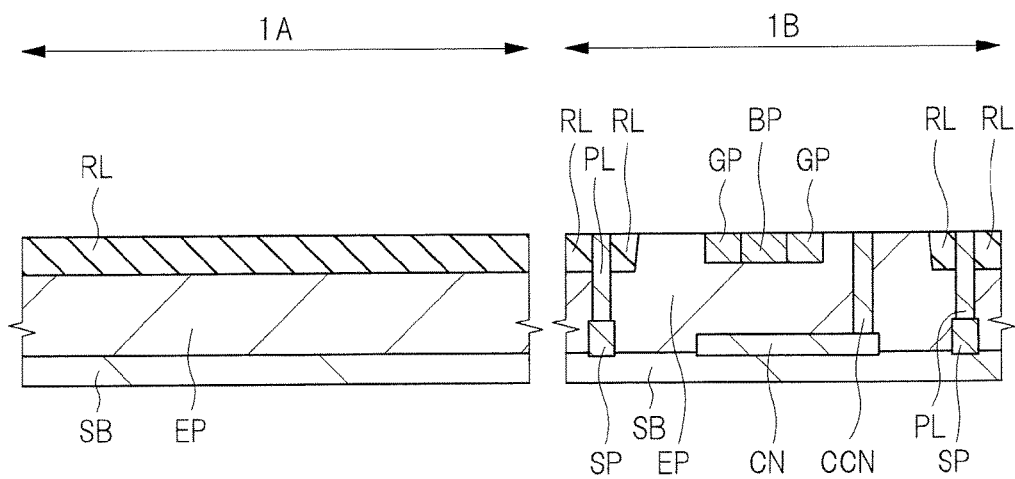
FIG. 9 is a cross-sectional view illustrating the manufacturing process of the semiconductor device continued from FIG. 8.

Next, as illustrated in FIG. 9, the $P^-$ type layer BP is formed by implanting a P type impurity (for example, B (boron)) into the main surface of the epitaxial substrate EP right above the $N^+$ type buried layer CN of the transistor region 1B by using the photolithography technique and an ion implantation method. Subsequently, the pair of $P^+$ type layers GP sandwiching the $P^-$ type layer BP in the lateral direction is formed by implanting a P type impurity (for example, B (boron)) into the main surface of the epitaxial substrate EP right above the N$^+$ type buried layer CN of the transistor region 1B by using the photolithography technique and the ion implantation method.

The P$^+$ type layer GP is in contact with the P$^-$ type layer BP, and the P$^+$ type layer GP has an impurity concentration higher than that of the P$^-$ type layer BP. At this time, the P type semiconductor layer is not formed in the fuse region 1A. The P$^-$ type layer BP and the P$^+$ type layer GP have a formation depth shallower than that of the element isolation region RL.

Figure 10:
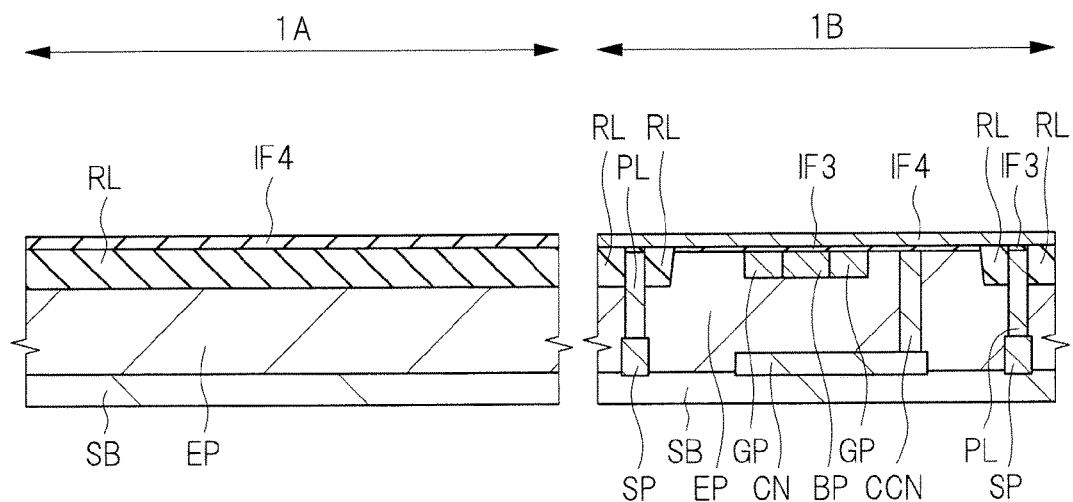
FIG. 10 is a cross-sectional view illustrating the manufacturing process of the semiconductor device continued from FIG. 9.

Next, as illustrated in FIG. 10, the insulating film IF3 made of a silicon oxide film is formed on the main surface of the epitaxial substrate EP. The insulating film IF3 is formed on the active region, and is hardly formed on the element isolation region RL. Thereafter, the insulating film IF4 is formed on the main surface of the epitaxial substrate EP by using, for example, the CVD method. A film thickness of the insulating film IF4 is, for example, 50 to 4000 A. Here, the insulating film IF4 is formed to have the film thickness of 1500 A. The insulating film IF4 is formed so as to cover the upper surface of the element isolation region RL in the fuse region 1A. The insulating film IF4 is formed so as to cover the upper surfaces of the element isolation region RL and the insulating film IF3 in the transistor region 1B.

The insulating film IF4 is made of a silicon nitride film or a silicon carbide film. The silicon nitride film or the silicon carbide film constituting the insulating film 154 has a thermal conductivity higher than that of the silicon oxide film constituting the element isolation region RL and the insulating film IF3. Specifically, a thermal conductivity of silicon oxide is 1.38 (W/m·K), a thermal conductivity of silicon nitride is 20 to 28 (W/m·K), and a thermal conductivity of silicon carbide is 150 to 170 (W/m·K).

In addition, the silicon nitride film or the silicon carbide film constituting the insulating film IF4 has a relatively low adhesion to the silicon oxide film constituting the element isolation region RL and the insulating film IF3. Specifically, the adhesion of the insulating film IF4 to a silicon oxide film is lower than the adhesion of the fuse element (polysilicon film) to a silicon oxide film.

It is conceivable that the adhesion between substances decreases as a difference in thermal expansion coefficient or linear expansion coefficient between the substances which adhere to each other increases. Here, while the thermal expansion coefficient of silicon oxide (SiO$_2$) is 0.51 to 0.58 ($\times 10^{-6}$/K), the thermal expansion coefficient of silicon (Si) is 2.4 ($\times 10^{-6}$/K), the thermal expansion coefficient of silicon nitride (SiN) is 3 to 3.5 ($\times 10^{-6}$/K), and the thermal expansion coefficient of silicon carbide (SiC) is 4 to 4.5 ($\times 10^{-6}$/K). Accordingly, the SiN film or the SiC film has the lower adhesion to the surface of an SiO$_2$ film than the Si film, and is more easily peeled off from the surface of the SiO$_2$ film.

Figure 11:
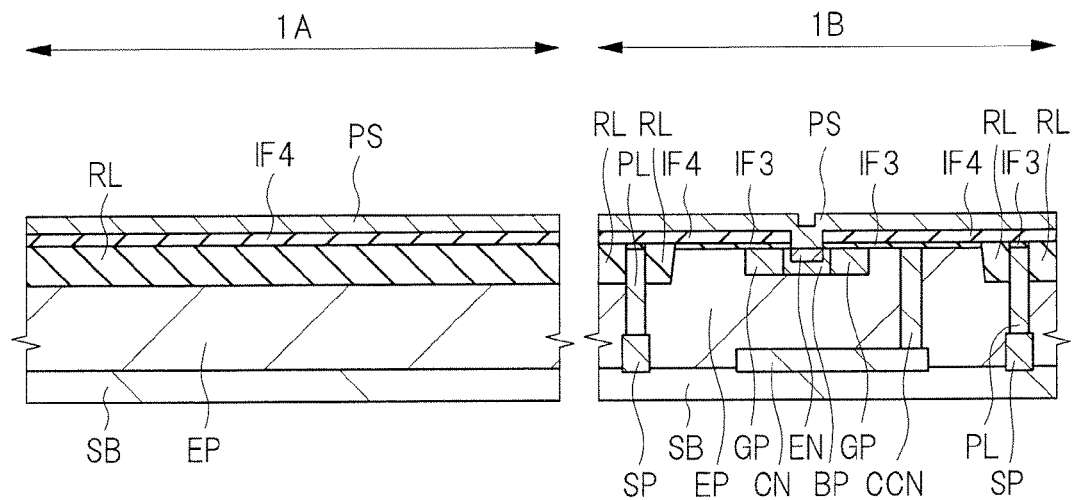
FIG. 11 is a cross-sectional view illustrating the manufacturing process of the semiconductor device continued from FIG. 10.

Next, as illustrated in FIG. 11, after a part of the insulating film IF4 of the transistor region 1B is removed by using the photolithography technique and the dry etching method, wet etching is performed with using the insulating film IF4 as a mask, thereby removing a part of the insulating film IF3. In this manner, a part of the upper surface of the P$^-$ type layer BP is exposed.

Subsequently, a polysilicon film PS is formed on the main surface of the epitaxial substrate EP by using, for example, the CVD method. Thereafter, an N type impurity (for example, As (arsenic) is implanted into the deposited polysilicon film PS at a relatively high concentration by the ion implantation method, so that the polysilicon film PS is turned into an N$^+$ type semiconductor film. Here, the impurity implantation amount is adjusted so that a sheet resistance ρs of the polysilicon film PS becomes 1 to 5000Ω/□. Here, the polysilicon film PS is formed to have the film thickness of 200 to 5000 A. The polysilicon film PS is in contact with the exposed upper surface of the P$^-$ type layer BP in the transistor region 1B.

Thereafter, the N type impurity in the polysilicon film PS is diffused to the upper surface of the P$^-$ type layer BP by performing the heat treatment. In this manner, the N$^+$ type layer EN containing an N type impurity (for example, As (arsenic)) is formed in the P$^-$ type layer BP. The N$^+$ type layer EN has a formation depth shallower than that of the P$^-$ type layer BP. An upper surface of the N$^+$ type layer EN is in contact with the polysilicon film PS.

Figure 12:
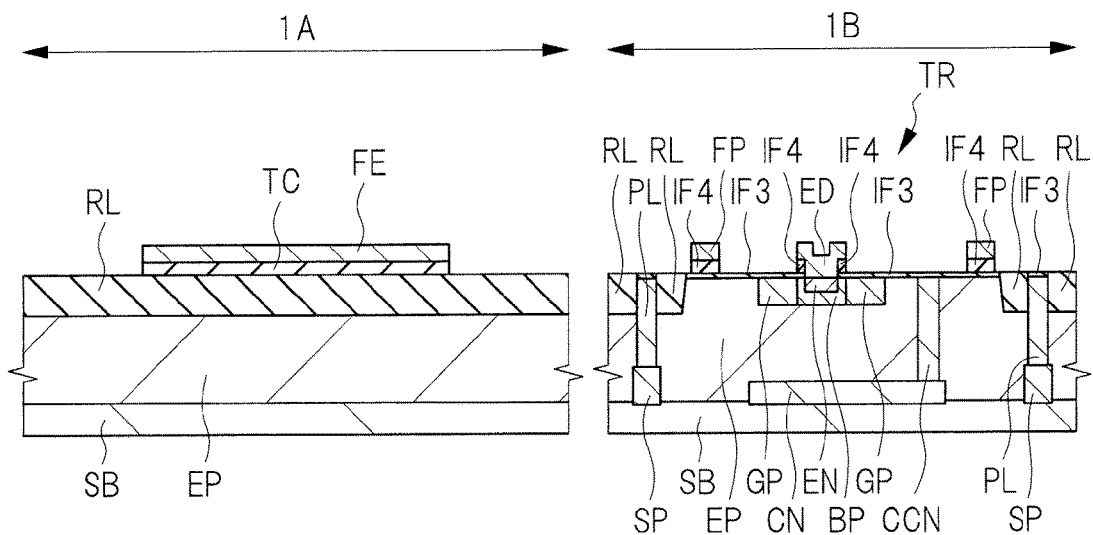
FIG. 12 is a cross-sectional view illustrating the manufacturing process of the semiconductor device continued from FIG. 11.

Next, as illustrated in FIG. 12, the polysilicon film PS and the insulating film IF4 are processed by using the photolithography technique and the dry etching method. In this manner, the upper surface of each of the insulating film IF3 and the element isolation region RL is exposed. Through the process mentioned above, the fuse element FE made of the polysilicon film PS is formed in the fuse region 1A. The fuse element FE has a pattern extending in one direction when seen in a plan view, and patterns of the contact portions which have a larger width than that of the extending portion at the center in the same direction are formed at both end portions of the pattern in the longitudinal direction. A planer layout of the fuse element FE is as illustrated in FIG. 1. Here, the insulating film IF4 below the fuse element FE is processed into the same pattern as the fuse element FE, so that the insulating film TC (see FIG. 12) made of the insulating film IF2 is formed.

Through the above-described process, the polysilicon film PS and the insulating film IF4 are removed in the transistor region 1B except for those in the active region. In addition, in the active region, the polysilicon film PS and the insulating film IF4 in the region other than the region of the end portion of the active region and the region right above the P$^-$ type layer BP are removed. In the end portion of the active region, the anti-inversion plate FP made of the polysilicon film PS is formed on the epitaxial substrate EP with the insulating films IF3 and IF4 sequentially interposed therebetween.

In addition, the emitter electrode ED made of the polysilicon film PS is formed right above the P$^-$ type layer BP. A part of the emitter electrode ED is formed on the main surface of the epitaxial substrate EP next to a region right above the N$^+$ type layer EN with the insulating films IF3 and IF4 sequentially interposed therebetween. The insulating films IF3 and IF4 are not formed right above the N$^+$ type layer EN, and the part of the emitter electrode ED which is in contact with the main surface of the epitaxial substrate EP is formed.

Through the process described with reference to FIG. 12, the vertical bipolar transistor TR is formed in the transistor region 1B. Namely, the bipolar transistor TR is an NPN-type transistor including the N$^+$ type layer EN serving as the emitter layer, the P$^-$ type layer BP serving as the base layer, and the N$^+$ type buried layer CN serving as the collector layer.

Figure 13:
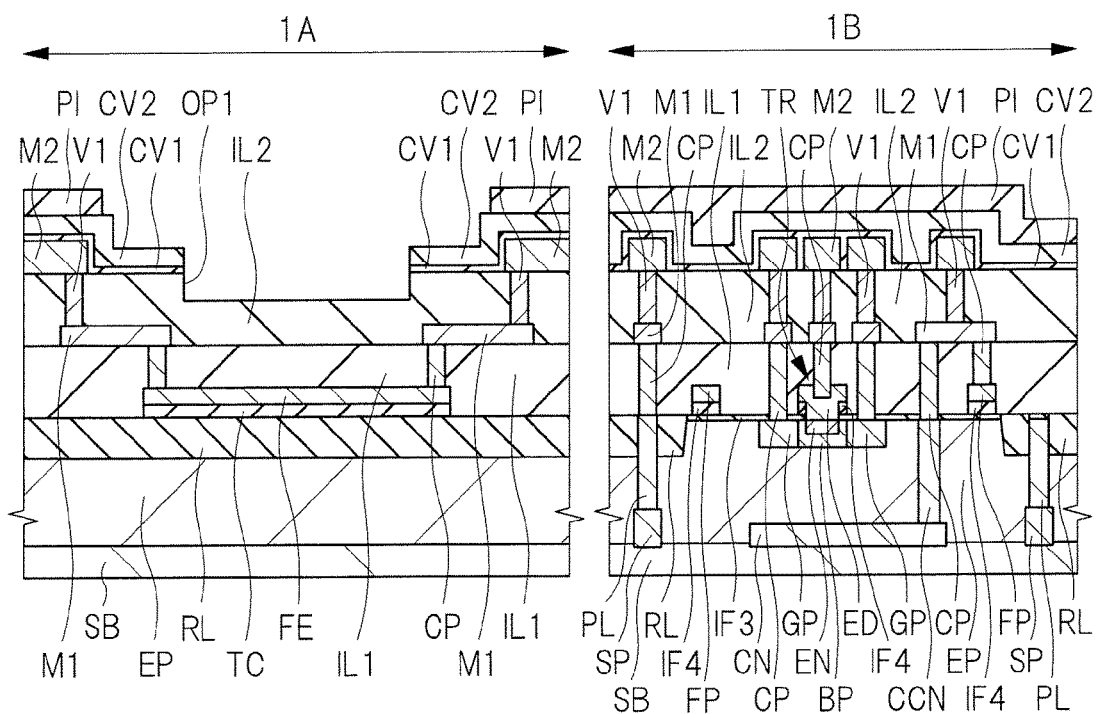
FIG. 13 is a cross-sectional view illustrating the manufacturing process of the semiconductor device continued from FIG. 12.

Next, as illustrated in FIG. 13, the interlayer insulating film IL1 is formed on the main surface of the epitaxial substrate EP by using, for example, the CVD method so as to cover the insulating films TC and IF4, the fuse element FE, the emitter electrode ED, the anti-inversion plate FP and the like. Thereafter, a plurality of contact holes which penetrate through the interlayer insulating film IL1 are formed, and then, the inside of each of the contact holes is buried with the contact plug CP mainly made of W (tungsten).

In the fuse region 1A, the contact plug CP is connected to the upper surface of each of both ends of the fuse element FE. In the transistor region 1B, each of the plurality of contact plugs CP penetrates through the insulating film IF4 and is connected to the upper surface of the P type layer PL, the upper surface of the N type contact layer CCN, or the upper surface of the type layer GP. In addition, other contact plugs CP are connected to the upper surface of the emitter electrode ED or the upper surface of the anti-inversion plate FP.

Subsequently, after a metal film is formed on each of the interlayer insulating film IL1 and the contact plug CP by using, for example, a sputtering method, the metal film is patterned to form the wiring M1 made of the metal film. The wiring M1 is made of, for example, an Al (aluminum) film, and is connected to each of the plurality of contact plugs CP in the fuse region 1A and the transistor region 1B. The interlayer insulating film IL1 is made of, for example, a silicon oxide film.

Subsequently, each of the interlayer insulating film IL1 and the wiring M1 is covered by the interlayer insulating film IL2 formed by, for example, the CVD method. The interlayer insulating film IL2 is made of, for example, a silicon oxide film. Thereafter, the plurality of via holes which penetrate through the interlayer insulating film IL2 are formed, and then, the inside of each of the via holes is buried with the via V1 mainly made of W (tungsten). Each of the plurality of vias V1 is connected to the upper surface of the wiring M1.

Subsequently, the wiring M2 is formed on the interlayer insulating film IL2 in the same manner as the wiring M1. The wiring M2 has a film thickness larger than that of the wiring M1. Each of the plurality of wirings M2 is connected to the upper surface of the via V1.

Subsequently, the cover insulating films CV1 and CV2 are sequentially formed on the interlayer insulating film IL2 so as to cover the wiring M2 by, for example, the CVD method. The cover insulating film CV1 is made of, for example, a silicon oxide film, and the cover insulating film CV2 is made of, for example, an SiON (silicon oxynitride) film.

Subsequently, in a range wider than the laser-irradiated portion in the case of performing the laser irradiation to the fuse element FE, the cover insulating films CV2 and CV1 of the laser-irradiated portion and the vicinity thereof and a part of the interlayer insulating film IL2 are removed, thereby forming the opening OP1. The above-described removing process of forming the opening OP1 is performed by using, for example, the photolithography technique and the dry etching method. The opening OP1 is formed at a position overlapping the extending portion of the fuse element FE, that is, the laser-irradiated portion when seen in a plan view. A distance from the bottom surface of the opening OP1 to the upper surface of the fuse element FE is, for example, 500 to 8000 A.

Subsequently, the wiring M2 to be a pad is exposed by removing the cover insulating films CV2 and CV1 in a region not illustrated in the drawing by using the photolithography technique and the dry etching method. Subsequently, a pattern constituted of the passivation film PI made of polyimide is formed on the cover insulating film CV2. In the above-described manner, the semiconductor device of the present embodiment is formed.

The fuse element FE of the present embodiment is cut by the laser beam if necessary in the case of performing the adjustment of circuit characteristics or the elimination of a defective circuit. In the process of cutting the fuse element FE by the laser irradiation, that is, in the laser trimming process, the laser irradiation is performed under the following conditions. Namely, the conditions of the laser irradiation performed to cut the fuse element FE are, for example, the irradiation energy of 0.1 to 0.6 µJ, the pulse width of 10 to 30 ns, and a spot size of 10 to 40 µm.

In the manufacturing method of the semiconductor device of the present embodiment, the insulating film TC made of a material having the high thermal conductivity is provided between the fuse element FE and the element isolation region RL as illustrated in FIG. 13. In the case of performing the laser trimming process, the insulating film TC provided below the fuse element FE is removed together with the fuse element FE. Accordingly, the opening OP2 is formed as illustrated in FIG. 3, and the fuse element FE is cut. Hereinafter, an effect of the manufacturing method of the semiconductor device of the present embodiment will be described with reference to the comparative example (see FIGS. 23 and 24).

As described with reference to FIGS. 23 and 24, in the semiconductor device of the comparative example, the fuse element FEa is formed so as to be in contact with the upper surface of the element isolation region RL, so that the problem that the residue RE adheres to the fuse cut portion occurs. Namely, although the laser trimming is performed to cut the fuse element FEa, the fuse element FEa is electrically conducted due to the residue RE serving as the leakage path, so that the problem of the decrease in the reliability of the semiconductor device occurs.

However, the high accuracy is required for the laser trimming from the viewpoint of preventing the occurrence of the leakage in the fuse element FEa subjected to the laser trimming and the viewpoint of preventing the surface of the element isolation region RL from having the abnormal shape due to the laser irradiation. However, it is difficult to enhance the accuracy of the laser irradiation in the laser trimming process, and further, it is difficult to enhance the accuracy of the film thickness of the interlayer insulating films IL1 and IL2 on the fuse element FEa and below the opening OP1. Namely, it is difficult to remove the fuse element FEa without leaving the residue RE and to prevent the element isolation region RL from being destroyed and having an abnormal shape. Thus, since the yield rate of the product decreases, a yield rate of the semiconductor device decreases, so that a problem of increasing the manufacturing cost occurs.

Meanwhile, in the present embodiment, the insulating film TC which has the high thermal conductivity and the low adhesion to a silicon oxide film is formed on the element isolation region RL of the fuse region 1A illustrated in FIG. 13, and thus, it is possible to obtain the same effect as that described with reference to FIGS. 1 to 4, 23 and 24. In addition, since it is possible to prevent the occurrence of the leakage and the occurrence of the abnormal shape of the element isolation region of the laser-irradiated portion, it is possible to enhance the yield rate of the product. Accordingly, it is possible to enhance the yield rate in the process of manufacturing the semiconductor device, and it is possible to reduce the manufacturing cost of the semiconductor device.

Therefore, it is possible to prevent the leakage of the cut fuse element FE without enhancing the accuracy of the laser irradiation in the laser trimming process or the accuracy of the film thickness of the interlayer insulating films IL1 and IL2 on the fuse element FE and below the opening OP1 illustrated in FIG. 13. Specifically, since it is possible to provide a margin regarding the accuracy of the laser irradiation and the accuracy of the film thickness of the insulating film on the fuse element FE, the manufacturing process of the semiconductor device is facilitated, and thus it is possible to reduce the manufacturing cost of the semiconductor device.

In addition, as illustrated in FIG. 13, the insulating film TC can be formed of a film in the same layer as the insulating film IF3 serving as a part of the bipolar transistor TR in the present embodiment. Also, the fuse element FE can be formed of a film in the same layer as the emitter electrode ED serving as apart of the bipolar transistor RT and the anti-inversion plate FP. Accordingly, a part of the structure of each of the bipolar transistor TR and the fuse element FE can be formed in the common process. Thus, when both of the bipolar transistor TR and the fuse element FE are mounted on the same semiconductor chip, the manufacturing process can be simplified.

Second Embodiment

Figure 19:
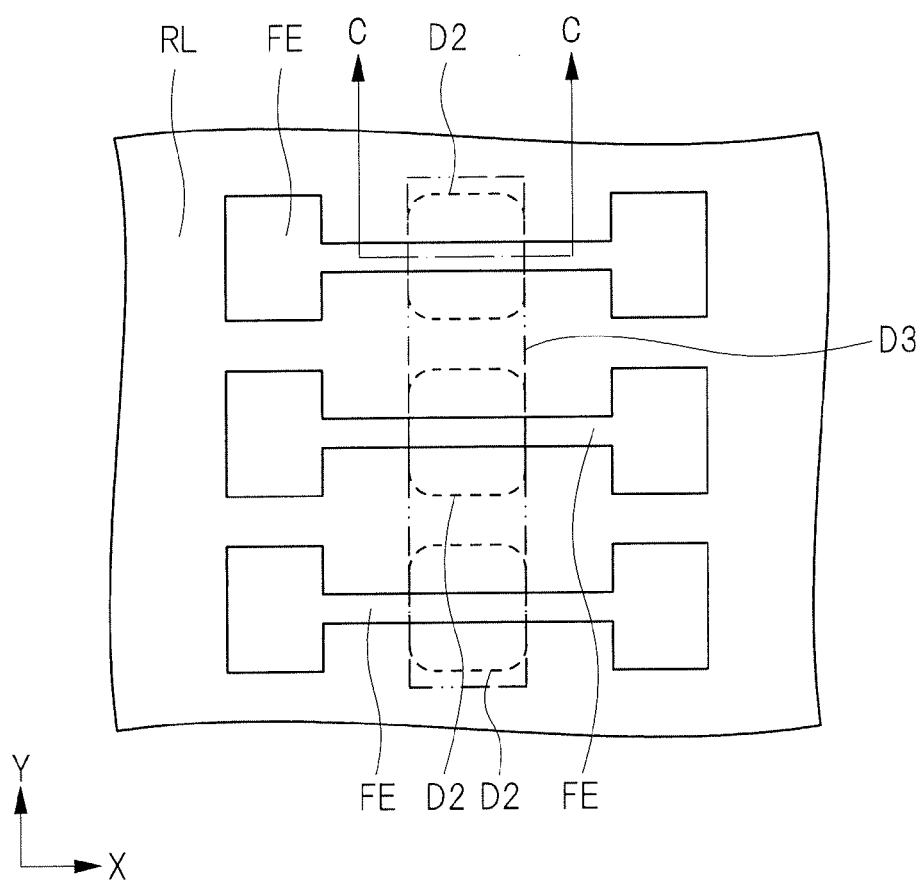
FIG. 19 is a plan view of the semiconductor device of the second embodiment.
Figure 20:
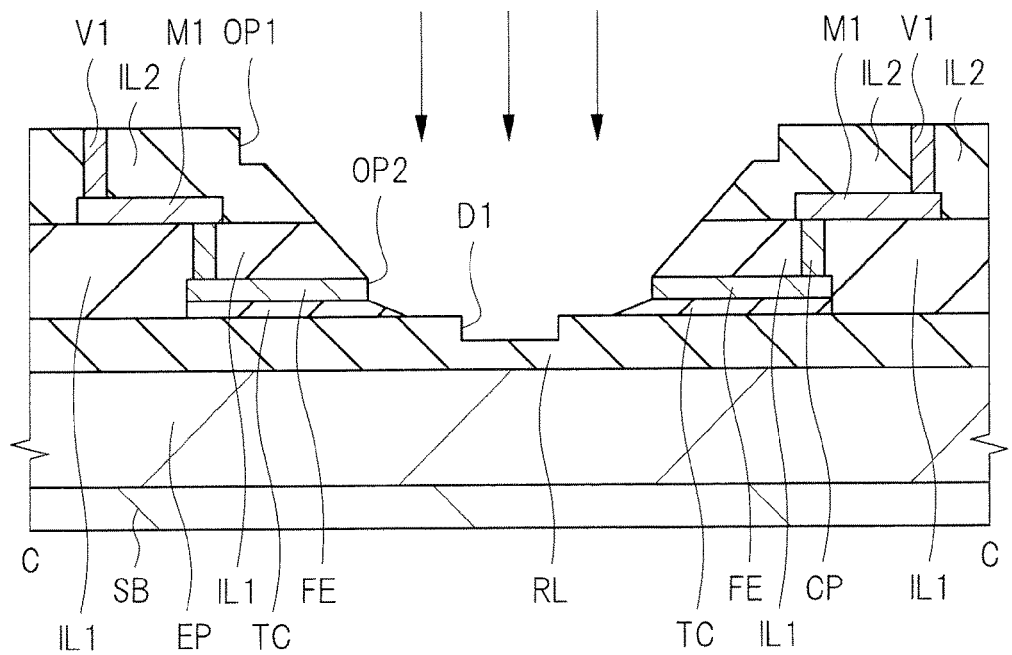
FIG. 20 is a cross-sectional view of the semiconductor device of the second embodiment.

Hereinafter, a technique of preventing the occurrence of the leakage current by forming a film having a high thermal conductivity below the fuse element and forming a concave portion on the upper surface of the element isolation region right below the fuse element will be described with reference to FIGS. 14 to 20. In the present embodiment, the occurrence of the leakage current is prevented by extending the leakage path in which the leakage current can flow in the cut portion of the fuse element subjected to the laser trimming. FIGS. 14 to 18 are cross-sectional views for describing a manufacturing method of a semiconductor device of the present embodiment. FIGS. 14 to 18 illustrate the fuse region 1A and the transistor region 1B like FIGS. 5 to 13. FIG. 19 is a plan view illustrating the semiconductor device of the present embodiment. FIG. 20 is a cross-sectional view taken along the line C-C of FIG. 19 in the case of performing the laser trimming.

Figure 14:
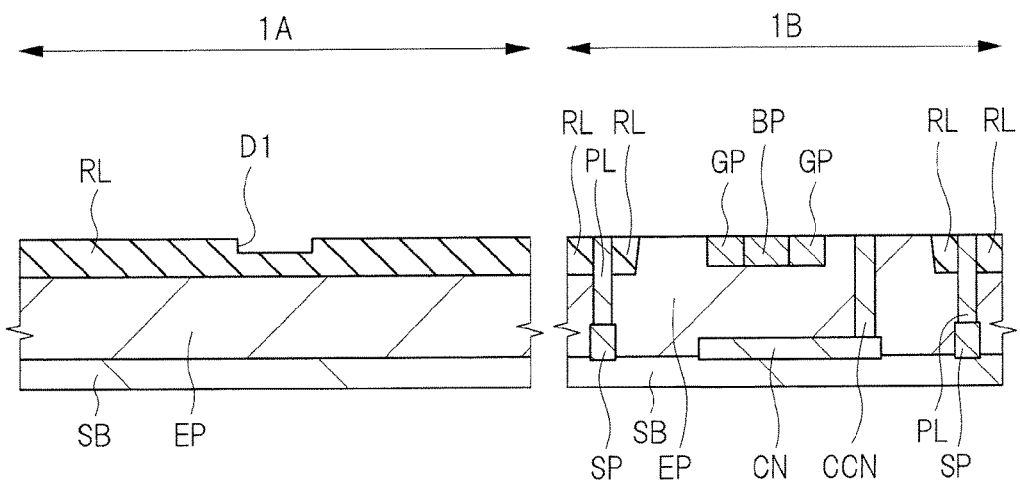
FIG. 14 is a cross-sectional view illustrating a manufacturing process of a semiconductor device of a second embodiment.

First, as illustrated in FIG. 14, the element isolation region RL is formed on a substrate made up of the semiconductor substrate SB and the epitaxial substrate EP, and various semiconductor layers are formed in the substrate by performing the same processes as those described with reference to FIGS. 5 to 9.

Subsequently, a groove D1 corresponding to the concave portion is formed on the upper surface of the element isolation region RL in the fuse region 1A by using the photolithography technique and the dry etching method or the wet etching method. The groove D1 is a stepped portion which is formed by recessing a part of the upper surface of the element isolation region RL to reach an intermediate depth of the element isolation region FL without penetrating through the element isolation region RL. It is conceivable that a sidewall of the groove D1 is formed along a direction perpendicular to the main surface of the epitaxial substrate EP.

However, in the case where the groove D1 is formed by the wet etching method, it is conceivable that the sidewall of the groove D1 is tapered with respect to the main surface of the epitaxial substrate EP. Namely, it is conceivable that an opening width of the groove D1 gradually becomes larger from a bottom portion of the groove D1 toward an upper side. In the drawing, the structure in which the sidewall of the groove D1 is formed to be perpendicular to the main surface of the epitaxial substrate EP is illustrated. The groove D1 is formed in a region which is irradiated with a laser beam in the laser trimming process. For example, the groove D1 is formed right below a center portion in the extending direction of the fuse element FE. In this case, the center portion of the fuse element FE in the extending direction is a center portion of an irradiation spot of the laser beam.

Figure 15:
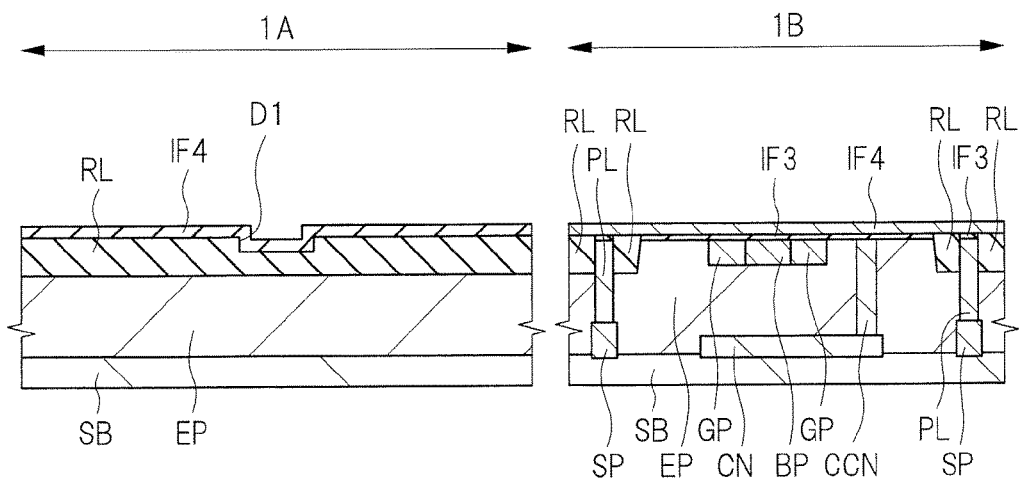
FIG. 15 is a cross-sectional view illustrating the manufacturing process of the semiconductor device continued from FIG. 14.

Next, as illustrated in FIG. 15, the insulating film IF3 is formed on the element isolation region RL by performing the same process as that described with reference to FIG. 10. It is desirable that the upper surface of the insulating film IF3 is flat with the inclusion of a region right above the groove D1 on the element isolation region RL of the fuse region 1A, but it does not matter if the insulating film IF3 has a relatively small film thickness and is formed along the sidewall of the groove D1 and a groove is formed on the upper surface of the insulating film IF3 right above the groove D1 as illustrated in FIG. 15.

Figure 16:
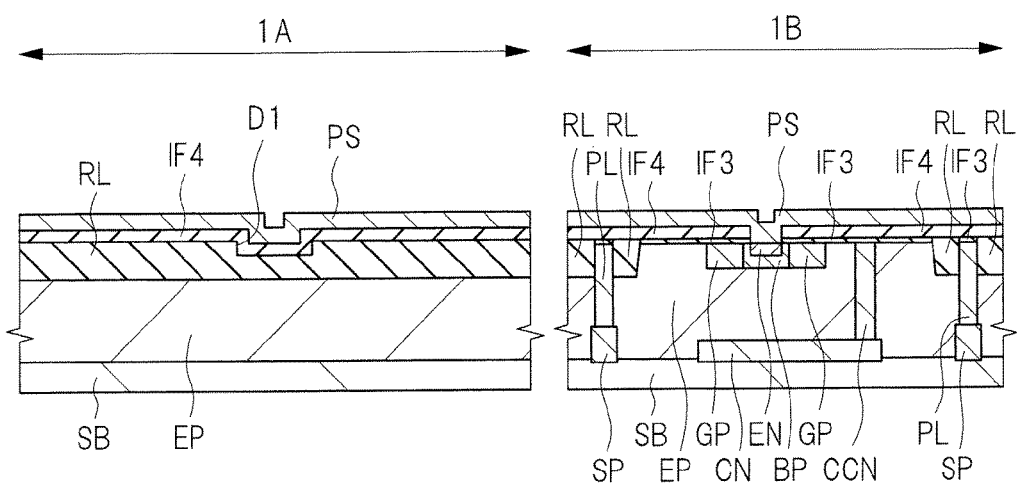
FIG. 16 is a cross-sectional view illustrating the manufacturing process of the semiconductor device continued from FIG. 15.

Next, as illustrated in FIG. 16, the polysilicon film PS is formed on the insulating film IF3 by performing the same process as that described with reference to FIG. 11.

Figure 17:
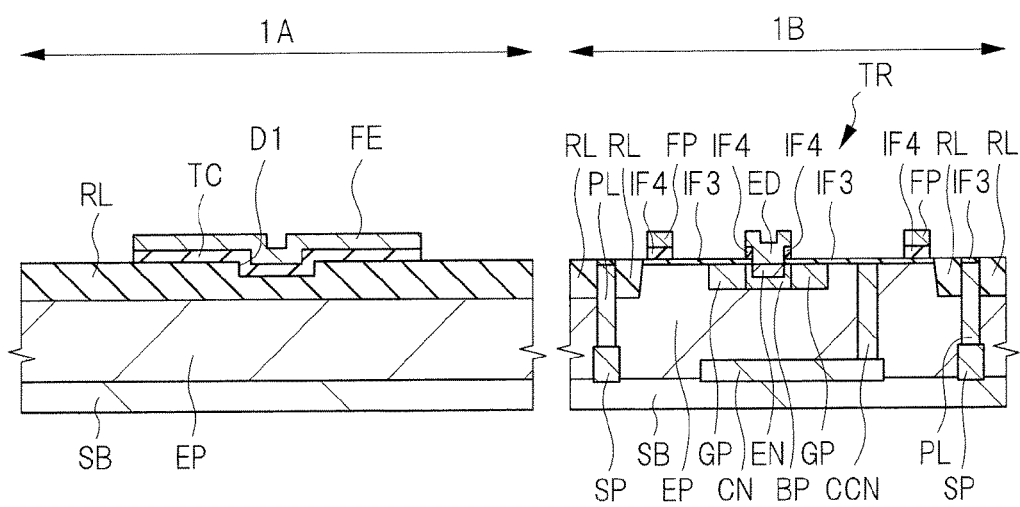
FIG. 17 is a cross-sectional view illustrating the manufacturing process of the semiconductor device continued from FIG. 16.

Next, as illustrated in FIG. 17, the bipolar transistor TR and the fuse element FE made of the polysilicon film PS are formed by performing the same process as that described with reference to FIG. 12. It is desirable that the upper surface of the fuse element FE is flat with the inclusion of a region right above the groove D1, but it does not matter if a groove is formed on the upper surface of the fuse element FE right above the groove D1 as illustrated in FIG. 17.

Figure 18:
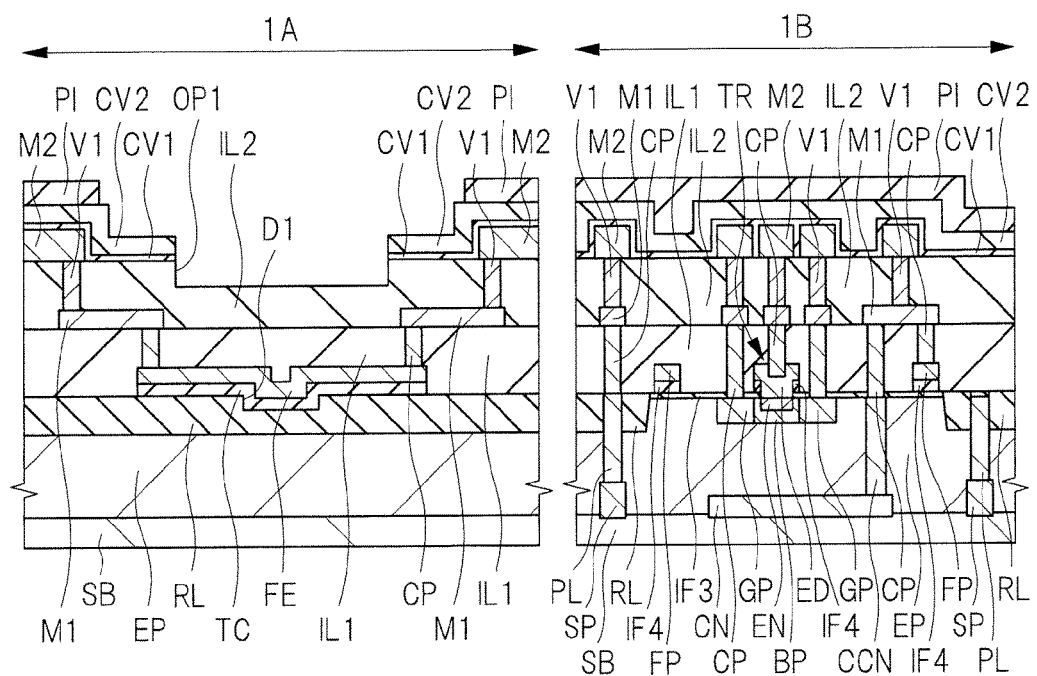
FIG. 18 is a cross-sectional view illustrating the manufacturing process of the semiconductor device continued from FIG. 17.

Next, as illustrated in FIG. 18, the interlayer insulating films IL1 and IL2 that cover the fuse element FE and the bipolar transistor TR and other wirings are formed by performing the same process as that described with reference to FIG. 13, thereby forming the semiconductor device of the present embodiment. Here, FIG. 19 illustrates the plan view of the semiconductor device of the present embodiment. FIG. 19 illustrates the plurality of fuse elements FE and illustrations of the interlayer insulating film, the wiring and the like on the fuse elements FE are omitted like FIG. 1.

FIG. 19 illustrates an example of a profile of the groove D1 (see FIG. 18) by a pattern D2 of a broken line. In addition, FIG. 19 illustrates another example of the profile of the groove D1 (see FIG. 18) by a pattern D3 of a two-dot chain line. As indicated by the broken line in the drawing, the pattern D2 of the groove may be formed so as to correspond to each of the fuse elements FE arranged in the Y direction. Namely, the patterns D2 of the grooves right below the respective fuse elements FE are separated from each other. Alternatively, as indicated by the two-dot chain line in the drawing, the respective fuse elements FE arranged in the Y direction may share a pattern D3 of one groove extending in the Y direction. Namely, the pattern D3 of the one groove may overlap the plurality of fuse elements FE when seen in a plan view.

Next, a structure of the fuse element FE after being irradiated with a laser beam in the laser trimming process will be described with reference to FIG. 20. Irradiation conditions of the laser beam: are the same as those of the first embodiment. The opening OP2 is formed after the laser irradiation as described with reference to FIG. 4. Here, the structure of FIG. 20 is different from that of FIG. 4 in that the insulating film TC formed in the groove D1 is removed and a surface on the inner side of the groove D1 is exposed.

In the present embodiment, it is possible to obtain the same effects as those of the first embodiment described above. In addition, it is possible to obtain the effects to be described below.

In the present embodiment, the groove D1 is formed on the upper surface of the element isolation region RL in a region from which the fuse element FE and the insulating film TC have been removed by the laser irradiation, that is, the bottom portion of the opening OP2. Specifically, the sidewall and the bottom surface of the groove D1 are exposed on the bottom surface of the opening OP2. As described by using the comparative example (see FIG. 24), the upper surface of the element isolation region EL between the cut fuse elements FE becomes a path of the leakage current in some cases. Meanwhile, in the present embodiment, it is possible to extend the path of the leakage current by forming the groove D1. Namely, since the groove D1 is formed, the sidewall on the inner side of the groove D1 is added as the path of the leakage current to the upper surface of the element isolation region RL next to the groove D1 and the bottom surface of the groove D1.

Accordingly, even when the conductive residue RE (see FIG. 24) adheres to the upper surface of the element isolation region RL in the region from which the fuse element FE has been removed, since the path in which the leakage current flows is long in comparison with that of the comparative example, it is possible to prevent the short circuit or the like due to the residue RE and the occurrence of the leakage. In addition, since it is possible to lengthen the leakage path, it is possible to prevent the decrease of the resistance value of the fuse subjected to the laser trimming due to the leakage. Accordingly, it is possible to prevent the abnormal operation of the circuit connected to the fuse element FE. Thus, it is possible to improve the reliability of the semiconductor device.

In addition, the above-described conductive residue RE vertically drops and is deposited with respect to the upper surface of the element isolation region RL from which the fuse element FE and the insulating film TC have been removed by the laser irradiation. Accordingly, it is preferable that the sidewall of the groove D1 is perpendicular to the main surface of the epitaxial substrate EP. This is because the residue RE which vertically drops and is deposited with respect to the upper surface of the element isolation region RL is less likely to adhere to the sidewall of the groove D1 when the sidewall is formed to be perpendicular to the epitaxial substrate EP. Therefore, it is possible to effectively prevent the formation of the leakage path when the sidewall of the groove D1 is formed to be perpendicular to the epitaxial substrate EP. It is desirable that dry etching, that is, anisotropic etching is used in the process of forming the groove D1 described with reference to FIG. 14 in order to form the sidewall of the groove D1 to be perpendicular to the epitaxial substrate EP.

Modified Example

Figure 21:
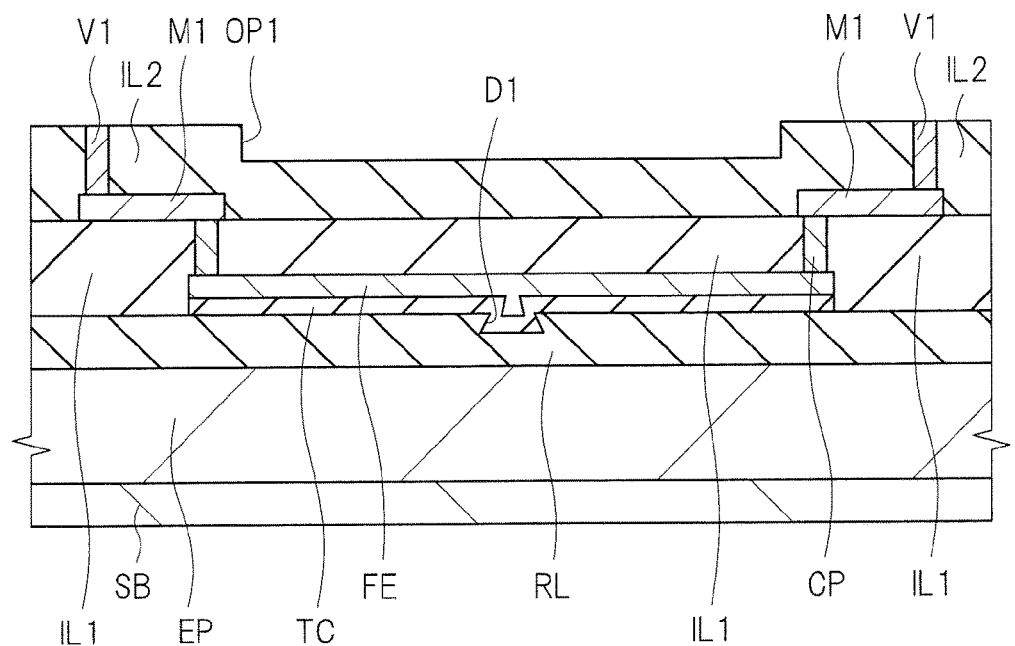
FIG. 21 is a cross-sectional view of a modified example of the semiconductor device of the second embodiment.
Figure 22:
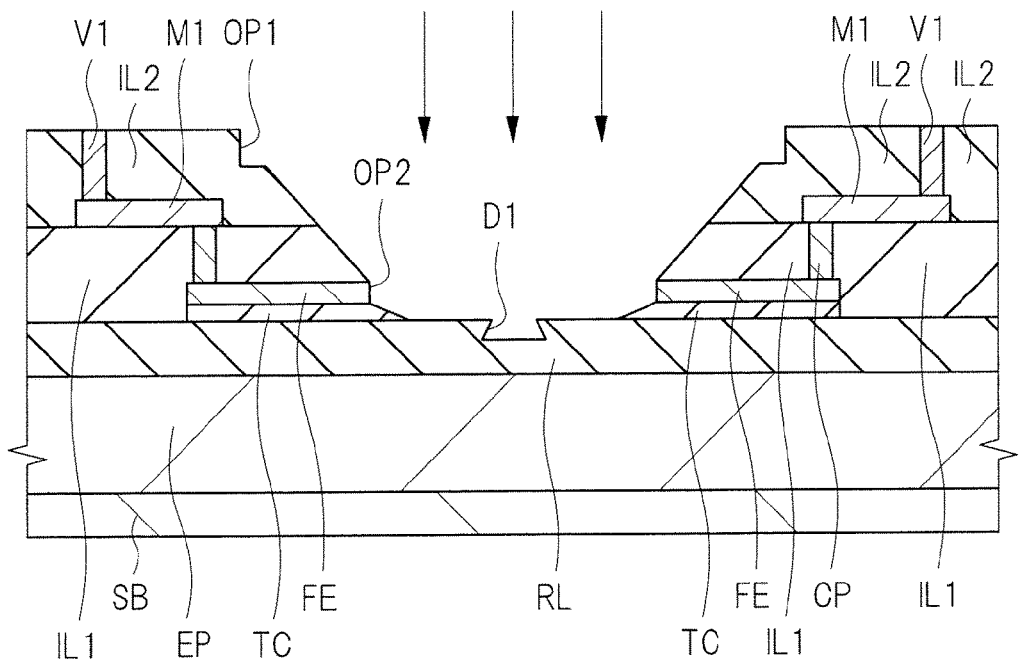
FIG. 22 is a cross-sectional view of the modified example of the semiconductor device of the second embodiment.

Hereinafter, a modified example of the semiconductor device of the present embodiment will be described with reference to FIGS. 21 and 22. FIGS. 21 and 22 are cross-sectional views of the modified example of the semiconductor device of the present embodiment. FIG. 21 illustrates the fuse element FE to which the laser trimming is not performed in an enlarge manner, and FIG. 22 illustrates the fuse element FE to which the laser trimming has been performed in an enlarged manner. In FIGS. 21 and 22, illustrations of the film and others provided above the interlayer insulating film IL2 are omitted so as to make the drawing easily understood. A difference between the modified example and the structure illustrated in FIGS. 18 to 20 is that the sidewall of the groove D1 is formed like eaves as illustrated in FIGS. 21 and 22.

Specifically, as illustrated in FIGS. 21 and 22, the sidewall of the groove D1 has a reverse tapered angle with respect to the main surface of the epitaxial substrate EP. Namely, the opening width of the groove D1 gradually becomes smaller from a bottom portion of the groove D1 toward an upper side. In other words, the sidewall of the groove D1 has an overhang shape.

As described above, the conductive residue RE (see FIG. 24) vertically drops and is deposited with respect to the upper surface of the element isolation region RL from which the fuse element FE and the insulating film TC have been removed by the laser irradiation. Accordingly, when the sidewall of the groove D1 has the eave-like shape, it is possible to more effectively prevent the residue RE from adhering to the sidewall of the groove D1 in comparison with the case in which the sidewall of the groove D1 is formed to be perpendicular to the epitaxial substrate EP as illustrated in FIG. 20. Consequently, it is possible to more effectively prevent the formation of the leakage path.

It is desirable that dry etching, that is, anisotropic etching is used in the process of forming the groove D1 described with reference to FIG. 14 in order to form the sidewall of the groove D1 like the eaves as described in the present embodiment.

In the foregoing, the invention made by the inventor of the present invention has been concretely described based on the embodiments. However, it is needless to say that the present invention is not limited to the foregoing embodiments and various modifications and alterations can be made within the scope of the present invention.

EXPLANATION OF REFERENCE CHARACTERS

1A: FUSE REGION
1B: TRANSISTOR REGION
CP: CONTACT PLUG
CV1, CV2: COVER INSULATING FILM
EP: EPITAXIAL SUBSTRATE
FE: FUSE ELEMENT
IF3, IF4: INSULATING FILM
IL1, IL2: INTERLAYER INSULATING FILM
M1, M2: WIRING
OP: OPENING
PI: PASSIVATION FILM
RL: ELEMENT ISOLATION REGION
SB: SEMICONDUCTOR SUBSTRATE
TC: INSULATING FILM
TR: BIPOLAR TRANSISTOR

The invention claimed is:

1. A semiconductor device comprising:
a semiconductor substrate;
a first insulating film on the semiconductor substrate;
a second insulating film formed on the first insulating film; and
a fuse including a conductive film containing silicon formed on the second insulating film,
wherein a portion of an upper surface of the first insulating film is exposed through an opening formed in a portion of the fuse and the second insulating film positioned above the first insulating film, and
wherein the second insulating film has a thermal conductivity higher than a thermal conductivity of the first insulating film.

2. The semiconductor device according to claim 1,
wherein an expansion coefficient of the second insulating film is higher than an expansion coefficient of a silicon film, and an expansion coefficient of the first insulating film is lower than an expansion coefficient of the silicon film, so that adhesion of the second insulating film to the first insulating film is lower than adhesion of the silicon film to the first insulating film.

3. The semiconductor device according to claim 1,
wherein a groove is formed on the upper surface of the first insulating film right below the conductive film, and
a portion of the second insulating film is buried in the groove.

4. The semiconductor device according to claim 3,
wherein a sidewall of the groove is formed to be perpendicular to a main surface of the semiconductor substrate.

5. The semiconductor device according to claim 3,
wherein a sidewall of the groove is tapered such that an opening width of the groove becomes smaller from a bottom portion of the groove toward an upper portion of the groove.

6. The semiconductor device according to claim 1, further comprising:
a third insulating film formed on the conductive film,
wherein the opening is formed by a portion of a stacked film made up of the second insulating film, the conductive film forming the fuse, and the third insulating film,
the fuse is cut by the opening, and
the portion of the upper surface of the first insulating film is exposed on a bottom surface of the opening.

7. The semiconductor device according to claim 6,
wherein a sidewall of a groove formed on the upper surface of the first insulating film is exposed on the bottom surface of the opening.

8. The semiconductor device according to claim 6,
wherein, in plan view, in a sidewall inside the opening the second insulating film terminates at a position closer to a center of the opening than the conductive film.

9. The semiconductor device according to claim 1,
wherein the first insulating film contains silicon oxide, and
the second insulating film contains silicon nitride or silicon carbide.

10. The semiconductor device according to claim 1, comprising
a plurality of fuses, each fuse including a conductive film including silicon formed on the first insulating film with the second insulating film interposed therebetween, and
wherein some of the plurality of fuses are cut.

* * * * *